(12) United States Patent
Lee

(10) Patent No.: US 8,330,481 B2
(45) Date of Patent: Dec. 11, 2012

(54) PROBE ASSEMBLY AND MANUFACTURING METHOD THEREOF

(76) Inventor: Jae Ha Lee, Paju-Si (KR)

( * ) Notice: Subject to any disclaimer, the term of this patent is extended or adjusted under 35 U.S.C. 154(b) by 181 days.

(21) Appl. No.: 12/667,128

(22) PCT Filed: Apr. 21, 2008

(86) PCT No.: PCT/KR2008/002237
§ 371 (c)(1),
(2), (4) Date: Dec. 29, 2009

(87) PCT Pub. No.: WO2009/005214
PCT Pub. Date: Jan. 8, 2009

(65) Prior Publication Data
US 2010/0327896 A1  Dec. 30, 2010

(30) Foreign Application Priority Data

Jul. 2, 2007 (KR) .................. 10-2007-0066005
Nov. 30, 2007 (KR) .................. 10-2007-0123686
Mar. 28, 2008 (KR) .................. 10-2008-0028824

(51) Int. Cl.
*G01R 31/00* (2006.01)
(52) U.S. Cl. .......... 324/756.03; 324/755.07; 324/754.03
(58) Field of Classification Search ............. 324/754.07, 324/756.03, 755.01–755.11, 754.03; 257/666; 439/66, 81
See application file for complete search history.

(56) References Cited

U.S. PATENT DOCUMENTS

| 5,670,889 | A | * | 9/1997 | Okubo et al. ............ 324/756.03 |
| 6,414,501 | B2 | | 7/2002 | Kim et al. |
| 6,452,407 | B2 | | 9/2002 | Khoury et al. |
| 6,777,319 | B2 | * | 8/2004 | Grube et al. .................. 438/612 |
| 7,714,235 | B1 | * | 5/2010 | Pedersen et al. ............... 174/267 |
| 7,990,165 | B2 | * | 8/2011 | Aoyagi et al. ............ 324/754.03 |
| 2008/0074127 | A1 | * | 3/2008 | Rhyu ............................. 324/754 |
| 2008/0074131 | A1 | * | 3/2008 | Kim ............................... 324/761 |

FOREIGN PATENT DOCUMENTS

JP  2003-35723  2/2003

* cited by examiner

*Primary Examiner* — Arleen M Vazquez
(74) *Attorney, Agent, or Firm* — IPLA P.A.; James E. Bame

(57) ABSTRACT

A probe assembly has insertion holes formed in a base layer provided on a circuit board. Probe pins are inserted into the insertion holes and fixed by a conductive adhesive filled in the insertion holes. The probe pins can be arranged with small pitch without mechanically electrically interfering with neighboring pins using the insertion holes. Furthermore, the base layer is formed of a semiconductor material to prevent a problem caused by a difference in the coefficient of thermal expansion between the base layer and a wafer. Moreover, coplanarity and alignment accuracy of the probe pins can be improved using aligning mask layers or aligning mask in a process of manufacturing the probe assembly. In addition, probe assembly manufacturing time can be reduced by using a pin array frame into which a large number of probe pins are temporarily inserted.

8 Claims, 19 Drawing Sheets

PROBE ASSEMBLY AND MANUFACTURING METHOD THEREOF

TECHNICAL FIELD

The present invention relates to a probe assembly and, more particularly, to a probe assembly of a probe card and a manufacturing method thereof.

BACKGROUND ART

In order to examine the electrical characteristics of small semiconductor devices (e.g., semiconductor chips in a wafer), a probe card is used as the medium of connection between a tester and a test target, i.e., semiconductor devices. As well known, such a semiconductor device has input/output terminals (also referred to as contact pads) exposed outwardly, and the probe card has probe pins that make a mechanical contact with the input/output terminals and also provide a path for electrical signals. That is, when receiving predetermined signals from the tester through the probe pins being in contact with the input/output terminals, the semiconductor device operates according to the received signals and then outputs the result to the tester through the probe pins.

In general, for a rapid and effective test, such a test process is performed by means of several probe pins that make simultaneous contacts with several terminals of the device. By the way, the size of the device becomes more and more reduced, and the number of the terminals becomes more and more increased. So the pad pitch, namely, the distance between adjacent terminals, also grows more and more decreased. For such reasons, the probe card needs a great number of probe pins that are arranged with a fine pitch corresponding to the pad pitch. However, as the pitch of the probe pins grows reduced, it is very difficult to arrange the probe pins without electrical and mechanical interference between adjacent pins. Additionally, it is important, but actually difficult, to precisely dispose the pins with a high level of coplanarity.

A known conventional solution for fine pitch arrangement of the probe pins is to use MEMS (micro electro-mechanical system) technique. This technique, however, inherently employs semiconductor fabrication process that causes complication and high cost. Therefore, another solution with simpler and cost-reduced process is required for a probe assembly.

On the other hand, a conventional probe assembly has a problem of probe pin contact failure due to a difference in thermal expansion between the wafer and the probe assembly. Generally, a hot test and a cold test are used to test the semiconductor devices in the wafer under extreme conditions. Though there are minor differences in such test conditions between semiconductor manufacturers, a temperature of the wafer is commonly increased to 120° C. in the hot test and decreased to −40° C. in the cold test. The probe pin contact failure often occurs while these tests are performed.

Referring to FIG. 1, since the wafer W and the probe assembly 100 normally differ in a coefficient of thermal expansion, the probe pin 10 may deviate from the contact pad P on the wafer W, that is, from the input/output terminal of the semiconductor device during the hot test or the cold test. This problem may be more serious near edges of the probe assembly 100 as the size of the probe assembly 100 increases.

Another problem associated with a conventional probe assembly is exemplarily illustrated in FIG. 2. Referring to FIG. 2, when the probe pin 10 is in contact with the contact pad P on the wafer W, the surface of the wafer W and the probe pin 10 may be damaged due to a mechanical impact. This problem is generated when equipment that adjusts the contact distance between the contact pad P of the wafer W and the probe pins 10 wrongly operates so that it moves by more than a contact tip height of the pins 10. In this case, roots of the probe pins 10 as well as the surface of the wafer W may be remarkably damaged to cause a serious problem in the elasticity and position alignment of the probe pins 10.

In addition, the conventional probe assembly has various problems. For example, problem assembly manufacturing time increases as the number of probe pins increases and electronic devices are required to be simply formed in the probe assembly together with the probe pins.

DISCLOSURE OF INVENTION

Technical Problem

An object of the present invention is to provide a probe assembly and a manufacturing method thereof capable of forming probe pins on a circuit board with small pitch while preventing mechanical and electrical interferences between neighboring probe pins.

Another object of the present invention is to provide a probe assembly and a manufacturing method thereof capable of manufacturing the probe assembly at reduced manufacturing cost.

Yet another object of the present invention is to provide a probe assembly and a manufacturing method thereof capable of arranging a large number of probe pins in a small area of a circuit board with small pitch of several tens of micrometers while improving alignment accuracy and coplanarity.

Still another object of the present invention is to provide a probe assembly having the same coefficient of thermal expansion as that of a semiconductor wafer and a manufacturing method thereof.

A different object of the present invention is to provide a probe assembly and a manufacturing method thereof capable of preventing probe pins and a wafer from being mechanically damaged due to wrong operation of related equipment when the probe pins make contact with contact pads of the wafer.

Another different object of the present invention is to provide a probe assembly and a manufacturing method thereof capable of improving process efficiency to remarkably reduce manufacturing time.

Still another different object of the present invention is to provide a probe assembly and a manufacturing method thereof capable of simply forming electronic devices as well as probe pins.

Technical Solution

According to an aspect of the present invention, there is provided a probe assembly comprising a circuit board, a conductive adhesive, and probe pins. The circuit board is electrically connected to a circuit pattern and has pads formed thereon and arranged with small pitch. The conductive adhesive is formed on the pads. The probe pins are electrically connected to the pads and each of the probe pins has a connectable root, a laterally elongated beam, and a contact tip. The connectable root is vertically inserted into the conductive adhesive and mechanically fixed. The laterally elongated beam is bent at right angle to the connectable root and extended lengthwise in parallel with and at a distance from the surface of the circuit board. The contact tip is extended upwardly from one end of the laterally elongated beam, being opposite to the connectable root.

The probe assembly may further comprise a base layer. The base layer is formed on the surface of the circuit board at a distance from laterally elongated beams of the probe pins. The base layer has first insertion holes formed respectively corresponding to the pads and filled with the conductive adhesive.

According to another aspect of the present invention, there is provided a probe assembly for testing semiconductor devices formed on a wafer, which comprises a circuit board, a base layer, a conductive adhesive, and probe pins. The circuit board is electrically connected to a circuit pattern and has pads formed thereon and arranged with small pitch. The base layer is formed on the surface of the circuit board and has first insertion holes formed respectively corresponding to the pads. The conductive adhesive is formed in the first insertion holes. The probe pins are electrically connected to the pads. Each of the probe pins has a connectable root, a laterally elongated beam, and a contact tip. The connectable root is vertically inserted into the corresponding first insertion hole and mechanically fixed by the conductive adhesive. The laterally elongated beam is bent at right angle to the connectable root and extended lengthwise in parallel with and at a distance from the surface of the circuit board. The contact tip is extended upwardly from one end of the laterally elongated beam, being opposite to the connectable root. The base layer is formed of the same semiconductor material as the wafer.

According to still another aspect of the present invention, there is provided a probe assembly for testing semiconductor devices formed on a wafer, which comprises a circuit board, a base layer, a first conductive adhesive, a second conductive adhesive, and probe pins. The circuit board is electrically connected to a circuit pattern and has pads formed thereon and arranged with small pitch. The base layer is formed on the surface of the circuit board and has first insertion holes, second insertion holes, and a redistribution line. The second insertion holes are formed respectively corresponding to the pads, the first insertion holes are separately formed at positions different from the positions of the second insertion holes, and a redistribution line connects the first insertion holes and the second insertion holes. The first conductive adhesive and the second conductive adhesive are respectively formed in the first insertion holes and the second insertion holes. The probe pins are electrically connected to the pads through the redistribution line. Each of the probe pins has a connectable root, a laterally elongated beam, and a contact tip. The connectable root is vertically inserted into the corresponding first insertion hole and mechanically fixed by the first conductive adhesive, the laterally elongated beam is bent at right angle to the connectable root and extended lengthwise in parallel with and at a distance from the surface of the circuit board, and the contact tip is extended upwardly from one end of the laterally elongated beam, being opposite to the connectable root.

The base layer may be formed of the same semiconductor material as the wafer.

The probe assembly may further comprise a plating layer formed on sidewalls of the first insertion holes of the base layer in order to improve the adhesive strength between the base layer and the conductive adhesive.

The probe assembly may further comprise a supporting agent additionally formed on the conductive adhesive to envelop the connectable roots of the probe pins.

The probe assembly may further comprise a damper which is provided on the surface of the base layer and has a height higher than the height of the laterally elongated beam and lower than the height of the contact tip.

The base layer may further comprise a third insertion hole. In this case, the probe assembly may further comprise an electronic device inserted into the third insertion hole and fixed by the conductive adhesive.

The circuit board may be a block type circuit board having the circuit pattern formed on the top surface and side thereof.

According to still another aspect of the present invention, there is provided a method for manufacturing a probe assembly, comprising the steps of: preparing a circuit board electrically connected to a circuit pattern and having pads formed thereon and arranged with small pitch; forming a base layer having first insertion holes formed respectively corresponding to the pads on the surface of the circuit board; filling the first insertion holes with a conductive adhesive; and arranging probe pins each of which has a connectable root and a contact tip respectively bent at right angle to both ends of a laterally elongated beam in opposite directions in such a manner that the probe pins are inserted into the first insertion holes and mechanically fixed by the conductive adhesive.

According to still another aspect of the present invention, there is provided a method for manufacturing a probe assembly, comprising the steps of: preparing a circuit board electrically connected to a circuit pattern and having pads formed thereon and arranged with small pitch; forming a base layer having second insertion holes formed respectively corresponding to the pads, first insertion holes separately formed at positions different from the positions of the second insertion holes, and a redistribution line connecting the first insertion holes and the second insertion holes on the surface of the circuit board; filling the first insertion holes with a conductive adhesive; and arranging probe pins each of which has a connectable root and a contact tip respectively bent at right angle to both ends of a laterally elongated beam in opposite directions in such a manner that the probe pins are inserted into the first insertion holes and mechanically fixed by the conductive adhesive.

The method may further comprise the steps of: forming a first aligning mask layer having a flat surface on the base layer such that the first insertion holes are exposed outwardly; and forming a second aligning mask layer having aligning holes on the first aligning mask layer such that the flat surface is exposed outwardly before the step of filling the conductive adhesive in the first insertion holes. In this case, the probe pins are arranged such that the laterally elongated beams are vertically aligned through the flat surface and the contact tips are horizontally aligned through the aligning holes.

The method may further comprise the step of forming an aligning mask having aligning recesses on the base layer to align the contact tips through the aligning recesses after the step of arranging the probe pins.

The method may further comprise the steps of: preparing a pin array frame composed of a lower frame having a plurality of insertion holes and an upper frame having a plurality of insertion holes; and inserting a plurality of probe pins into the pin array frame in such a manner that contact tips of the probe pins are inserted into the insertion holes of the lower frame and connectable roots of the probe pins are inserted into the insertion holes of the upper frames. Here, the probe pins are arranged after the probe pins are inserted into the pin array frame.

Advantageous Effects

According to the present invention, the insertion holes of the base layer are formed respectively corresponding to the pads of the circuit board and the probe pins are firmly fixed through the conductive adhesive filled in the insertion holes.

By using the insertion holes, the probe pins can be easily arranged with small pitch and respectively reliably disposed without mechanically electrically interfering with neighboring pins because neighboring insertion holes provide spaces completely separated from each other. Furthermore, the areas of the insertion holes are sufficiently larger than the probe pins inserted thereinto, and thus the conductive adhesive can completely fill the insertion holes and fully envelope the probe pins to firmly support the probe pins. In addition, the method for manufacturing a probe assembly using insertion holes can easily manufacture a probe assembly at a reduced manufacturing cost.

Moreover, during a process of manufacturing a probe assembly, the probe pins can be vertically aligned through the flat surface of the first aligning mask layer to secure good coplanarity. Furthermore, the probe pins can be precisely aligned in the horizontal direction through aligning holes of the second aligning mask layer or aligning holes or aligning recesses of the aligning mask.

In addition, the base layer into which the probe pins are inserted and fixed is formed of the same semiconductor material as a wafer to be tested such that the base layer and the wafer have the same coefficient of thermal expansion. Accordingly, it is possible to solve the conventional problem that the probe pins deviate from the contact pads on the wafer during a hot test or a cold test due to a difference in the coefficient of thermal expansion between the wafer and the probe assembly.

Furthermore, the probe assembly of the present invention has the damper formed on the surface of the base layer, which has a height higher than the height of the laterally elongated beam of the probe pin and lower than the height of the contact tip, to prevent the conventional problem that a contact distance between neighboring probe pins decreases due to wrong operation of equipment that adjusts the contact distance so as to mechanically damage the probe pins and the wafer.

Moreover, the method for manufacturing a probe assembly according to the present invention performs a probe pin inserting process independently of the entire manufacturing process using the pin array frame into which a large number of probe pins are temporarily inserted. This improves process efficiency to remarkably reduce the time required to manufacture the probe assembly and the time required to deliver the probe assembly to related orderer when the probe assembly is order-manufactured.

In addition, the probe assembly of the present invention provides spaces in which electronic devices as well as the probe pins are formed through the insertion holes of the base layer, and thus the electronic devices can be formed easily and securely.

BRIEF DESCRIPTION OF THE DRAWINGS

FIGS. 17 to 36 are views showing a method for manufacturing a probe assembly in accordance with an eleventh embodiment of the present invention, wherein:

FIGS. 17 and 18 are a plan view and a cross-sectional view showing a circuit board;

FIGS. 19 and 20 are a plan view and a cross-sectional view showing a structure in which a base layer formed on the circuit board shown in FIGS. 17 and 18;

FIG. 21 is a perspective view showing an exemplary step of forming the base layer;

FIGS. 22 to 27 are cross-sectional views showing another exemplary step of forming the base layer;

FIGS. 28 to 32 are a cross-sectional view, a perspective view and a plan view showing an exemplary step of arranging and inserting probe pins;

FIGS. 33 and 34 are a perspective view and a cross-sectional view showing another exemplary step of arranging the probe pins; and FIGS. 35 and 36 are a perspective view and a cross-sectional view showing still another exemplary step of arranging the probe pins.

FIGS. 37 to 50 are views showing a method for manufacturing a probe assembly in accordance with a twelfth embodiment of the present invention, wherein:

FIGS. 37 and 38 are perspective views showing a step of arranging probe pins in a pin array frame;

FIGS. 39 to 42 are a plan view and a cross-sectional view showing a step of forming a base layer;

FIGS. 43 to 45 are cross-sectional views showing an exemplary step of inserting the probe pins using the pin array frame;

FIG. 46 is a cross-sectional view showing another exemplary step of inserting the probe pins using the pin array frame;

FIGS. 47 and 48 are cross-sectional views showing still another exemplary step of inserting the probe pins; and FIGS. 49 and 50 are cross-sectional views showing still another exemplary step of inserting the probe pins.

BEST MODE FOR CARRYING OUT THE INVENTION

Figure 1:
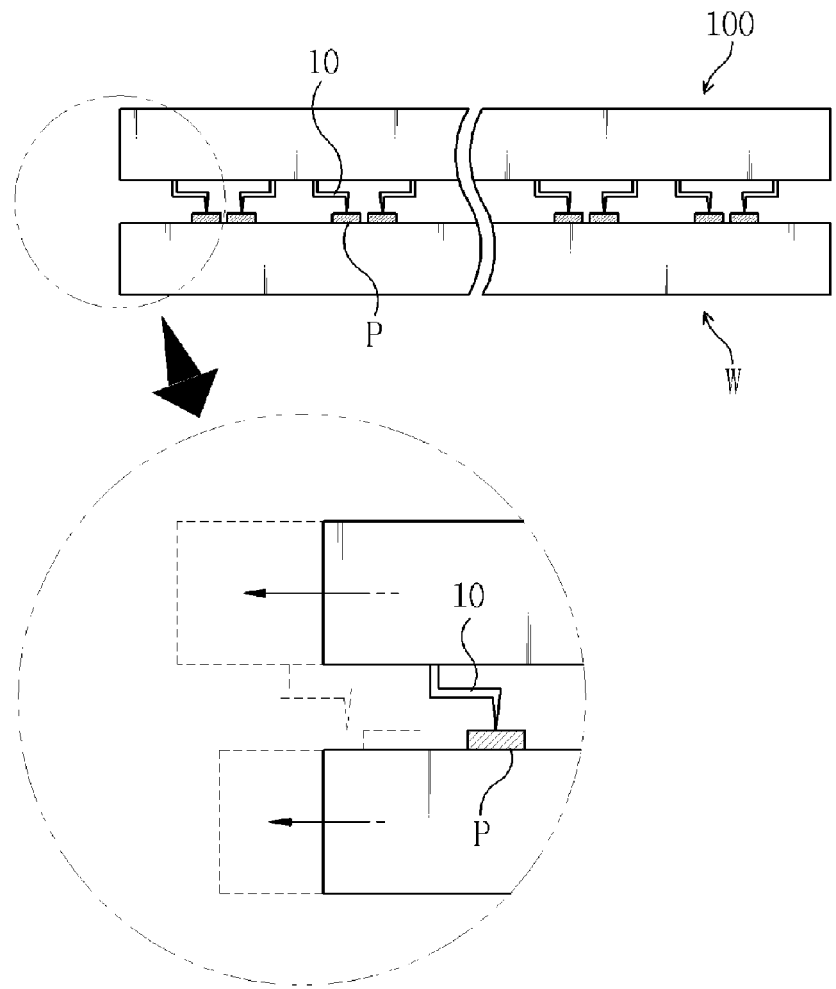
FIG. 1 is a schematic view illustrating a problem of a conventional probe assembly.

The present invention will now be described more fully hereinafter with reference to the embodiments below. This invention may, however, be embodied in many different forms and should not be construed as limited to the embodiments set forth herein. Rather, the disclosed embodiments are provided so that this disclosure will be thorough and complete, and will fully convey the scope of the invention to those skilled in the art.

Well-known structures and processes are not described or illustrated in detail to avoid obscuring the essence of the present invention. The figures are not drawn to scale. Rather, for simplicity and clarity of illustration, the dimensions of some of the elements are exaggerated relative to other elements. Like reference numerals are used for like and corresponding parts of the various drawings.

1st Embodiment

Probe Assembly

Figure 3:
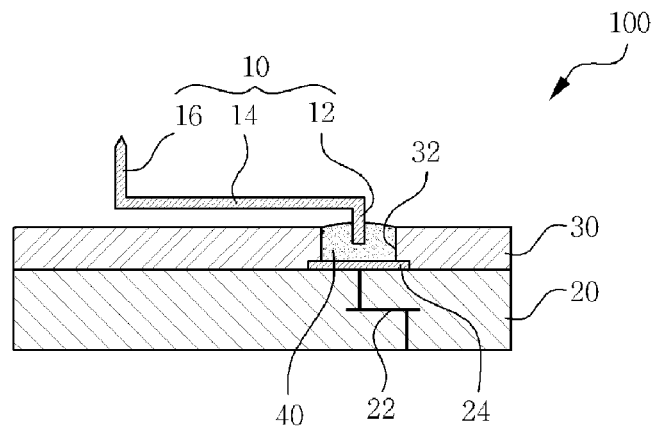
FIG. 3 is a cross-sectional view showing a probe assembly in accordance with a first embodiment of the present invention.

FIG. 3 is a cross-sectional view showing a probe assembly in accordance with a first embodiment of the present invention. Referring to FIG. 3, the probe assembly 100 is composed of probe pins 10, a circuit board 20, a base layer 30, and a conductive adhesive 40.

The circuit board 20, which is a printed circuit board (PCB) or a ceramic substrate, has a circuit pattern 22 formed therein and a plurality of pads 24 thereon. The circuit pattern 22, single-layered or multi-layered, is electrically connected to the pads 24 through via. The top surface of the circuit board 20 is covered with an insulating protective layer (not shown). The pads 24 are arranged with small pitch of several tens of micrometers throughout the top surface of the circuit board 20 without being covered with the protective layer. In general the circuit board 20 is combined with an interface board (not shown) of the probe card and electrically connected to a tester (not shown) through the interface board.

The base layer 30 is formed on the top surface of the circuit board 20. The base layer 30 has a plurality of insertion holes 32, each of which corresponds to each pad 24 on the circuit board 20. The base layer 30 is made of material that is resistant to heat and does not generate particles acting as a pollution source to the target of test, i.e., electronic devices. For example, the base layer 30 may be made of ceramic, FR4, polyimide, insulating organic material, epoxy, etc. In some cases, photoresist (PR) or dry film can be used for the base layer 30. If there is a possibility that a contact failure of the probe pins occurs due to a difference in the coefficient of thermal expansion between the wafer and the probe assembly, it is desirable that the base layer 30 uses the same material, e.g., silicon, as the semiconductor wafer does.

The conductive adhesive 40 that has both electrical conductivity and adhesive property is provided in the insertion holes 32. For example, the conductive adhesive 40 is metal-filled liquid adhesive, solder paste, or equivalents. Nickel (Ni), gold (Au), silver (Ag), copper (Cu), etc. may be used for metal fillers, and tin (Sn), zinc (Zn), indium (In), nickel (Ni), gold (Au), silver (Ag), etc. may be used for solder paste.

The probe pin 10 is formed in the shape of cantilever and made of tungsten (W) or any other conductive material. The probe pin 10 is composed of a connectable root 12, a laterally elongated beam 14, and a contact tip 16. The connectable root 12 is vertically inserted into the insertion hole 32 of the base layer 30, being mechanically fixed in the insertion hole 32 and electrically connected to the pad 24 by means of the conductive adhesive 40. The laterally elongated beam 14 is bent at right angle to the connectable root 12 and extended lengthwise in parallel with and at a distance from the base layer 30. The contact tip 16 is extended upwardly from one end of the laterally elongated beam 14, being opposite to the connectable root 12. The contact tip 16 is a part for making contact with a corresponding terminal of a target device.

In the probe assembly 100 of this embodiment, the base layer 30 with the insertion holes 32 is formed on the circuit board 20 with the pads 24, and the probe pins 10 are fixedly located in the insertion holes 32 through the conductive adhesive 40. The insertion holes 32 are formed at small pitch according to the positions of the pads 24, so the probe pins 10 can be easily and closely disposed by using the insertion holes 32. Additionally, since any two adjacent insertion holes 32 provide a completely separate space therebetween, the respective probe pins 10 can be reliably disposed without interfering with neighboring pins 10. Similarly, the adjacent insertion holes 32 allow the conductive adhesive 40 therein to be sufficiently separated. Furthermore, since the insertion hole 32 has an enough size to receive the probe pin 10, the conductive adhesive 40 can fully enclose the probe pin 10 in the insertion hole 32 and thus fixedly support the probe pin 10.

The probe assembly described hereinbefore has a basic structure, which may be varied or improved in a great variety of forms. Hereinafter, various embodiments of the probe assembly according to the present invention are described.

2nd Embodiment

Probe Assembly

Figure 4:
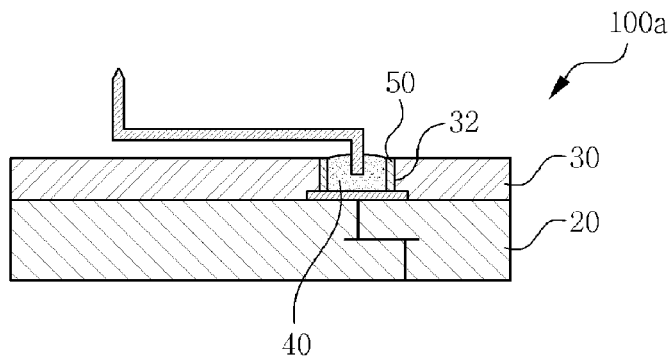
FIG. 4 is a cross-sectional view showing a probe assembly in accordance with a second embodiment of the present invention.

A probe assembly 100a shown in FIG. 4 is a case where a plating layer 50 is formed on sidewalls of the insertion hole 32 of the base layer 30.

The plating layer 50 in the insertion hole 32 may enhance the adhesive strength between the base layer 30 and the conductive adhesive 40. For that reason, the plating layer 50 may employ a material, such as gold, that has a good adhesive property with the conductive adhesive 40.

3rd Embodiment

Probe Assembly

Figure 5:
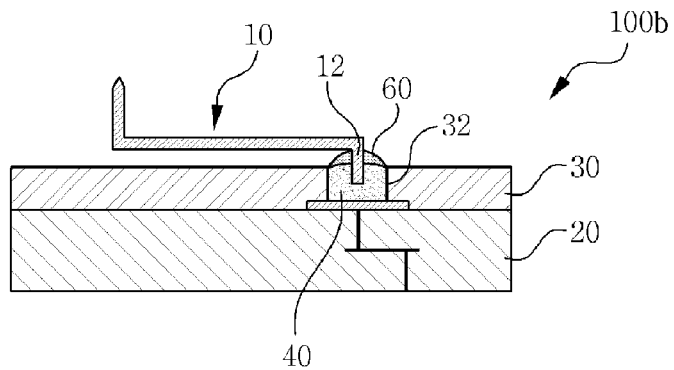
FIG. 5 is a cross-sectional view showing a probe assembly in accordance with a third embodiment of the present invention.

A probe assembly 100b shown in FIG. 5 is a case where a supporting agent 60 is used in addition to the conductive adhesive 40.

During a test, the probe pin 10 undergoes repeated mechanical contacts with the terminal of a target device. Therefore, due to fatigue stress, some of the probe pins 10 may deviate from an original position, fall down, or become deformed. In order to prevent such unfavorable results, the probe pins 10 should be firmly supported in the insertion holes 32 of the base layer 30. Of course, as discussed before, the conductive adhesive 40 that fully encloses the probe pin 10 in the insertion hole 32 can sufficiently support the probe pin 10. However, to maximize a supporting strength to the probe pin 10, the supporting agent 60 may be additionally used. The supporting agent 60 is formed on the conductive adhesive 40 and encloses the connectable root 12 of the probe pin 10, thus providing an additional supporting strength. Since the supporting agent 60 is out of the insertion hole 32, it is desirable that the supporting agent 60 uses nonconductive material such as epoxy.

4th Embodiment

Probe Assembly

Figure 6:
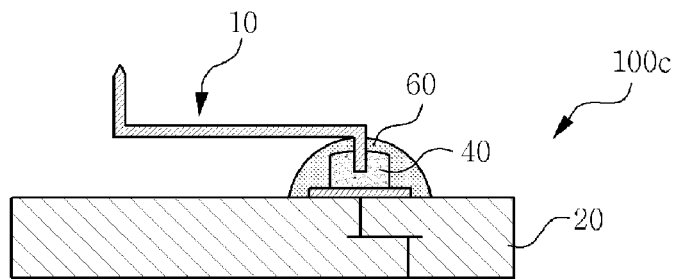
FIG. 6 is a cross-sectional view showing a probe assembly in accordance with a fourth embodiment of the present invention.

A probe assembly 100c shown in FIG. 6 is a case where the above-discussed base layer (30 in FIG. 3) is removed from and not included in the final structure.

As will be described again, the probe assembly may often need an aligning mask layer for alignment of the probe pins 10 during the process of manufacture, and this aligning mask layer is removed after alignment. If the base layer is made of the same material as the aligning layer, the base layer may be removed together with the aligning layer and not included in the final structure of the probe assembly. In this case, the supporting agent 60 may be additionally and favorably used, while fully covering the conductive adhesive 40.

5th Embodiment

Probe Assembly

Figure 7:
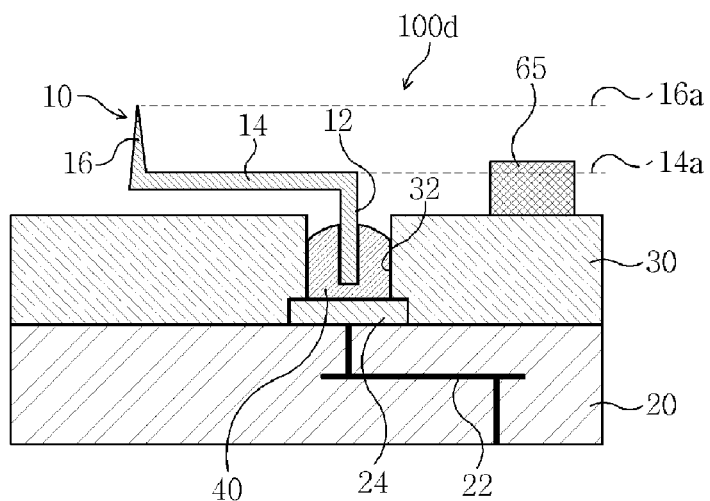
FIGS. 7 and 8 are cross-sectional views showing a probe assembly in accordance with a fifth embodiment of the present invention.
Figure 8:
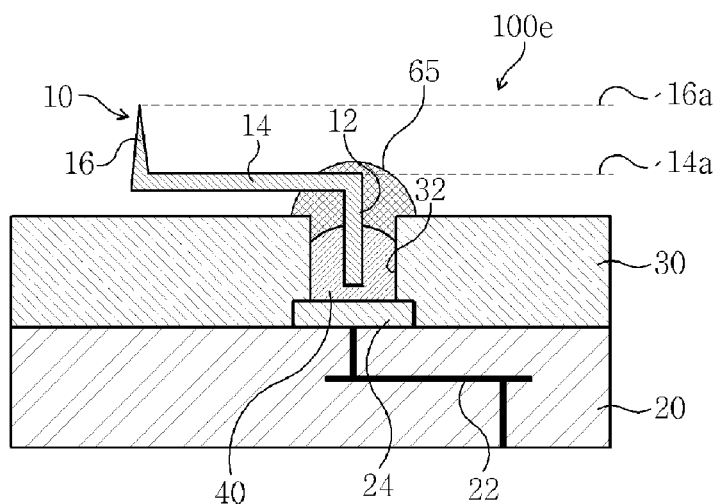

Probe assemblies 100d and 100e respectively shown in FIGS. 7 and 8 are characterized by a damper 65 provided on the base layer 30.

The damper 65 shown in FIG. 7 is formed at any positions except for the probe pin 10, and the damper 65 shown in FIG. 8 is formed to cover the connectable root 12 of the probe pin 10 at the insertion hole 32.

Figure 2:
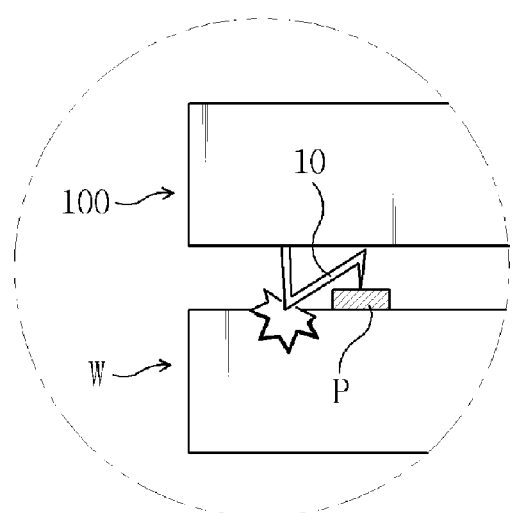
FIG. 2 is a schematic view illustrating another problem of a conventional probe assembly.

When the probe pins 10 are in contact with the contact pads (P in FIG. 2) of the wafer, the damper 65 protects the probe pins 10 and the surface of the wafer (W in FIG. 2) from being damaged on mechanical impact due to wrong operation of related equipment. So the height of the damper 65 should be higher than the height 14a of the laterally elongated beam 14. On the other hand, the damper 65 should allow normal contact movements of the probe pins 10 without disturbance, so the height of the damper 65 should be lower than the height 16a of the contact tip 16. The damper 65 may be preferably made of nonconductive material, such as epoxy, that is elastic and does not generate particles.

The damper 65 shown in FIG. 8, covering the connectable root 12 of the probe pin 10, acts as the supporting agent (60 in FIGS. 5 and 6) for the connectable root 12.

6th Embodiment

Probe Assembly

Figure 9:
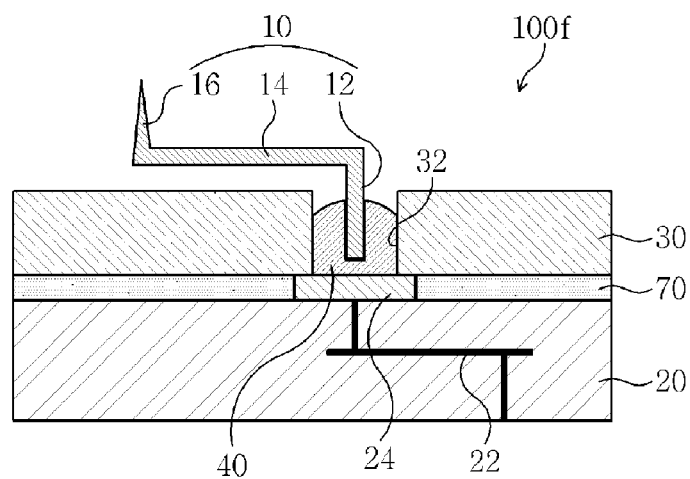
FIG. 9 is a cross-sectional view showing a probe assembly in accordance with a sixth embodiment of the present invention.

A probe assembly 100f shown in FIG. 9 is a case where the base layer 30 is bonded to the circuit board 20 through a nonconductive adhesive 70 interposed between the circuit board 20 and the base layer 30.

As described above, the base layer 30 can be formed using various materials. The method of forming the base layer 30 may depend on the material used to form the base layer 30. The nonconductive adhesive 70 may be required when the base layer 30 formed in the shape of sheet or film is bonded to the circuit board 20.

7th Embodiment

Probe Assembly

Figure 10:
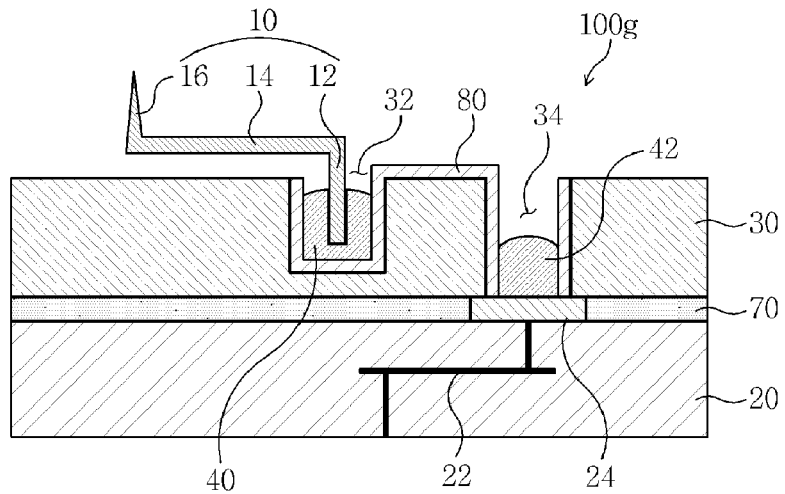
FIGS. 10 and 11 are cross-sectional views showing a probe assembly in accordance with a seventh embodiment of the present invention.
Figure 11:
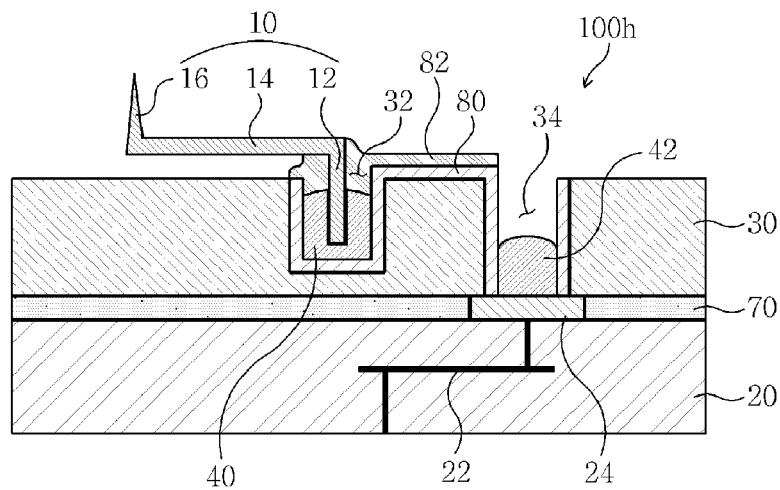

Probe assemblies 100g and 100h respectively shown in FIGS. 10 and 11 are characterized by first and second insertion holes 32 and 34 formed in the base layer 30 and a redistribution line 80 for electrically connecting the insertion holes 32 and 34.

Specifically, the first insertion hole 32 into which the connectable root 12 of the probe pin 10 is inserted and the second insertion hole 34 corresponding to the pad 24 of the circuit board 20 are formed at different positions separately from each other. There is no need for the first insertion hole 32 to completely penetrate the base layer 30 because the first insertion hole 32 is only required to have depth that can receive the connectable root 12 while the second insertion hole 34 penetrates the base layer 30 because it should be connected with the pad 24 disposed at the bottom of the base layer 30.

The redistribution line 80 is formed on the inner walls of the two insertion holes 32 and 34 and the portion of the surface of the base layer 30 disposed between the two insertion holes 32 and 34. The redistribution line 80 can be formed of a nonconductive material (e.g., metal) using a well-known deposition process (e.g., sputtering or plating after sputtering) since the redistribution line 80 provides an electrical path between the two insertion holes 32 and 34.

The conductive adhesive 40 (referred to as a first conductive adhesive hereinafter) is formed in the first insertion hole 32 and a conductive adhesive 42 (referred to as a second conductive adhesive hereinafter) is formed in the second insertion hole 34. The second conductive adhesive 42 allows mechanical contact and electrically connection between the redistribution line 80 and the pad 24.

As shown in FIG. 11, a plating layer 82 can be additionally formed on the redistribution line 80. The plating layer 82 improves conductivity of the redistribution line 80 and provides an additional supporting strength to the connectable root 12 being inserted into the first insertion hole 32.

8th Embodiment

Probe Assembly

Figure 12:
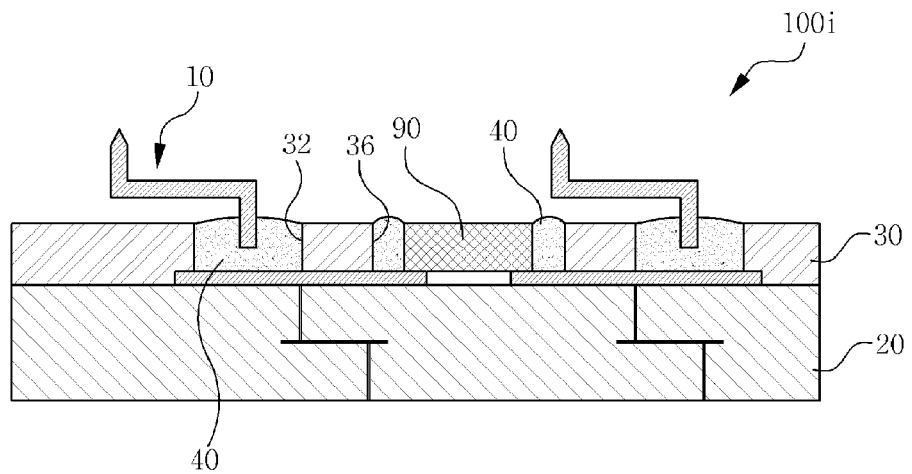
FIG. 12 is a cross-sectional view showing a probe assembly in accordance with an eighth embodiment of the present invention.

A probe assembly 100i shown in FIG. 12 is a case where an electronic device 90 is formed in addition to the probe pins 10.

The electronic device 90, such as a capacitor, a register, a condenser, a transistor, a relay, an integrated circuit, etc., is mounted on the circuit board 20 using surface mount technology (SMT) or directly formed in the base layer 30 through a semiconductor process.

In the former case, the electronic device 90 can be easily formed in such a manner that the electronic device 90 is inserted into a third insertion hole 36 of the base layer 30 an fixed with the conductive adhesive 40. The insertion holes 32 and 36 of the base layer 30 allow electronic and mechanical structures such as the probe pins 10 and the electronic device 90 to be boned to or mounted on the circuit board 20.

In the latter case, the electronic device 90 can be easily formed in the base layer 30 using semiconductor manufacturing process technology when the base layer 30 is formed of the same material as the wafer. Furthermore, when the probe assembly has the redistribution line (80 of FIG. 10) as described above in the eighth embodiment, the process of forming the electronic device 90 can be performed in connection with the process of forming the redistribution line.

9th Embodiment

Probe Assembly

Figure 13:
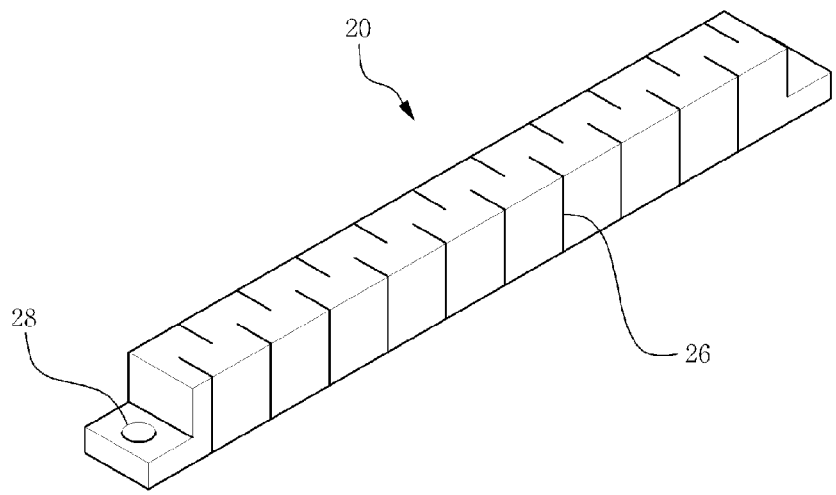
FIGS. 13 and 14 are perspective views showing a probe assembly in accordance with a ninth embodiment of the present invention.

The circuit board of the probe assembly can have various shapes. FIG. 13 shows a block type circuit board 20.

While the circuit board in the aforementioned embodiments is in a rectangular shape or a circular shape similar to the wafer and has a circuit pattern formed therein, the block type circuit board 20 is in a long block shape and has a circuit pattern 26 formed on the side and the top surface thereof. The circuit pattern 26 disposed on the top surface of the block type circuit board 20 corresponds to the pad of the above-described circuit board. The block type circuit board 20 has screw combining holes 28 respectively formed at both ends thereof. The block type circuit board 20 may be made of ceramic, FR4, polymer, and various materials that are not warped due to small thermal expansion and sufficient degree of hardness. The circuit pattern 26 can be formed through a deposition process such as sputtering or plating.

Figure 14:
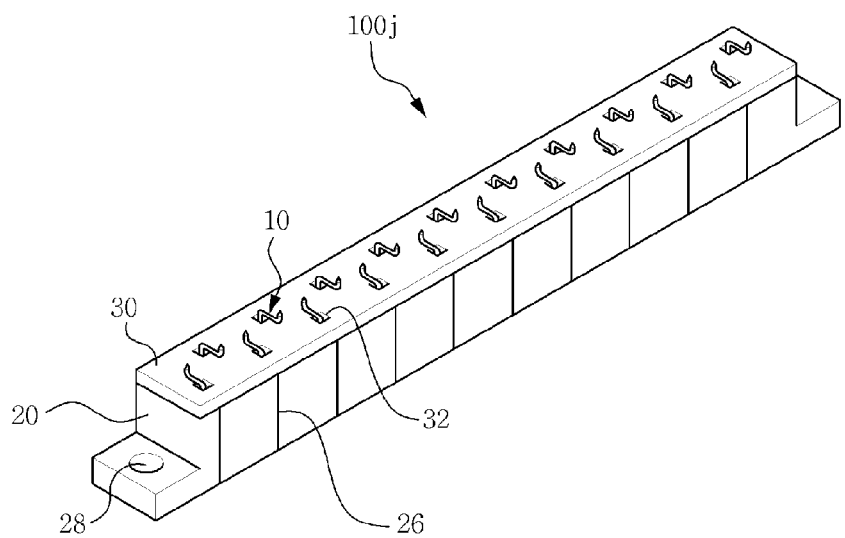

A probe assembly 100j shown in FIG. 14 uses the block type circuit board 20. The base layer 30 includes the insertion holes 32 corresponding to the circuit pattern 26 and is attached to the top surface of the block type circuit board 20. A conductive adhesive (not shown) is filled in the insertion holes 32 and the probe pins 10 are respectively inserted into the insertion holes 32 and fixed by the conductive adhesive. This probe assembly 100j is mounted on an interface board of a probe card through the screw combining holes 28. Here, a plurality of probe assemblies 100j can be adjacently mounted side by side.

10th Embodiment

Probe Assembly

Figure 15:
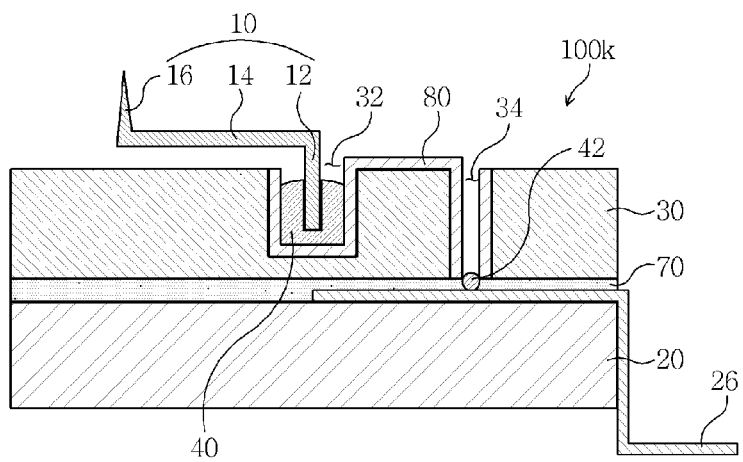
FIGS. 15 and 16 are perspective views showing a probe assembly in accordance with a tenth embodiment of the present invention.
Figure 16:
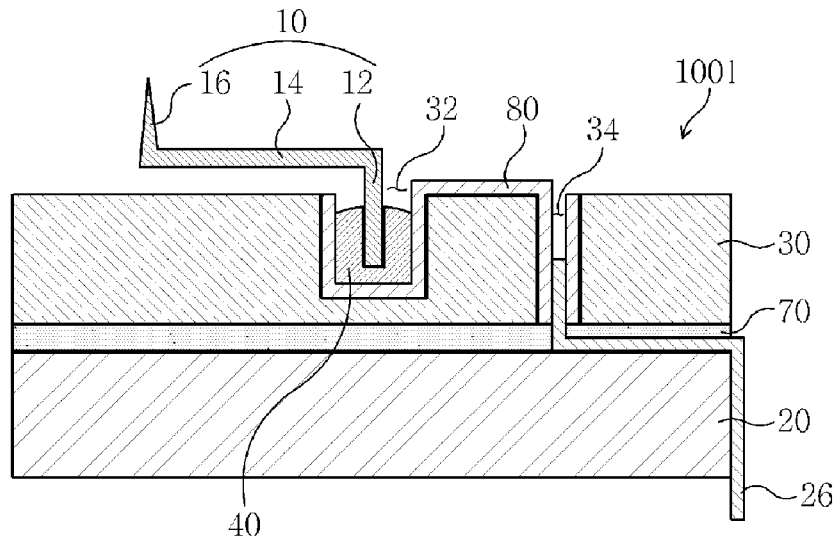

Probe assemblies 100k and 100l respectively shown in FIGS. 15 and 16 also use circuit boards 20 in different shapes. These circuit boards 20 are made of ceramic, FR4, polymer, etc. similarly to the block type circuit board of the ninth embodiment. The circuit pattern 26 is not formed in the circuit board 20 but formed on the top surface and side thereof. The circuit pattern 26 can be formed through a deposition process, bonded to a separately manufactured flexible printed circuit board (FPCB) or formed in such a manner that a groove is formed on the surface of the circuit board 20 and then a wire is buried in the groove.

Referring to FIG. 15, the circuit pattern 26 of the circuit board 20 is electrically connected to the second insertion hole 34 through the second conductive adhesive 42. Referring to FIG. 16, the top portion of the circuit pattern 26 of the circuit board 20 is vertically inserted into the second insertion hole 34 so the circuit pattern 26 is electrically connected to the second insertion hole 34.

The probe assemblies according to various embodiments of the present invention have been described. A method for manufacturing a probe assembly according to the present invention will now be explained. The structure of the probe assembly will become apparent from the following explanations.

11th Embodiment

Method for Manufacturing a Probe Assembly

FIGS. 17 to 36 are views showing a method for manufacturing a probe assembly in accordance with an eleventh embodiment of the present invention. The main point of the method of manufacturing a probe assembly according to this embodiment is that the base layer having insertion holes formed therein is used in order to bury a plurality of probe pins in a circuit board and aligning mask layers are used in order to precisely align the probe pins and secure a high level of coplanarity. Process steps of the method for manufacturing a probe assembly according to this embodiment can be partially changed, which is also explained.

Figure 17:
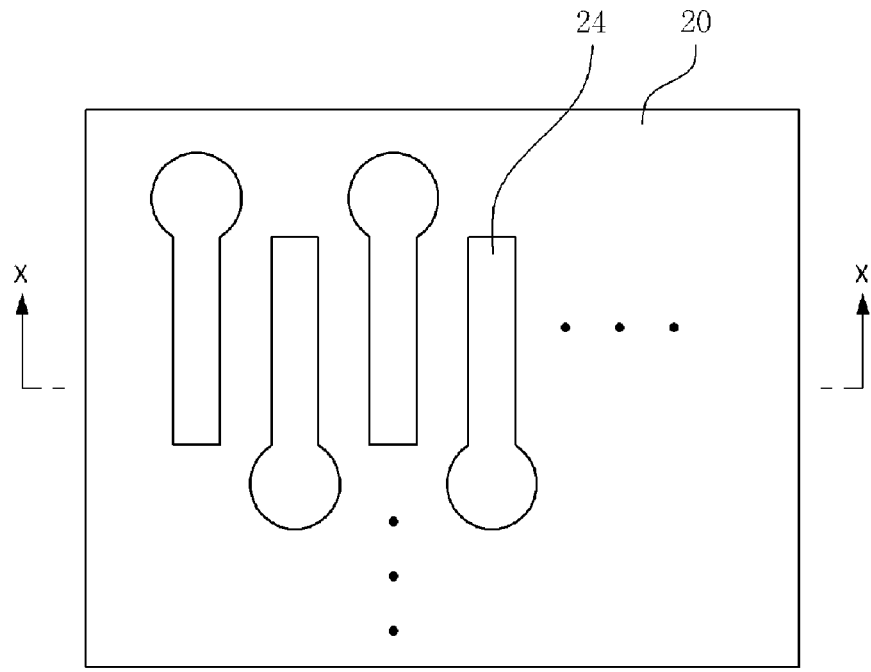
Figure 18:
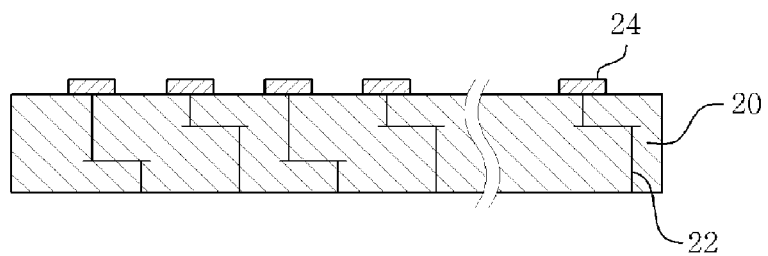

FIGS. 17 and 18 are a plan view and a cross-sectional view taken along line X-X of FIG. 17, which show the circuit board 20 functioning as a base of the probe assembly.

As shown in FIGS. 17 and 18, the circuit board 20 includes a circuit pattern 22 formed therein and a plurality of pads 24 formed thereon. The pads 24 are electrically connected to the circuit pattern 22 without being covered with an insulating protective layer (not shown). The pads 24 are arranged with small pitch of several tens of micrometers. The position, form, number and pitch of the pads 24 and the number of pad rows can be changed.

Figure 19:
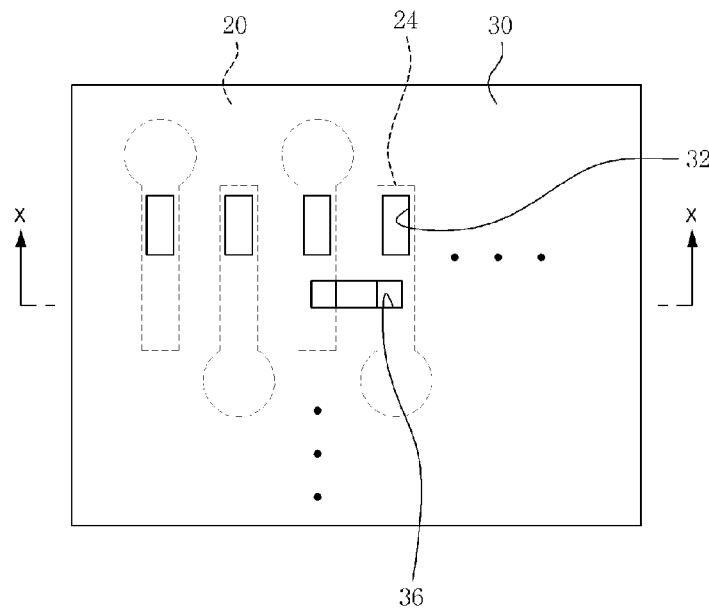
Figure 20:
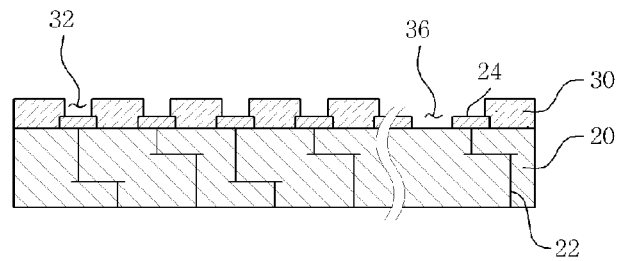

FIGS. 19 and 20 are a plan view and a cross-sectional view taken along line X-X of FIG. 19, which show a structure in which the base layer 30 is formed on the circuit board 20 shown in FIGS. 17 and 18.

As shown in FIGS. 19 and 20, the base layer 30 is formed on the circuit board 20. The base layer 30 has a plurality of first insertion holes 32 and at least one third insertion holes 36 formed therein. The first insertion holes 32 respectively correspond to the pads 24 of the circuit board 20 and the third insertion hole 36 is formed over two neighboring pads 24. Probe pins are inserted into the first insertion holes 32 and the electronic device described in the eighth embodiment is inserted into the third insertion hole 36. The base layer 30 may not have the third insertion hole 36 as it does in other embodiments. Even in the eighth embodiment, the third insertion hole 36 may not be required when the electronic device is directly formed in the baser layer 30.

The base layer 30 is attached to the circuit board 20 in the form of sheet or film or directly formed on the circuit board 20 through a manufacturing process. The former is exemplarily shown in FIG. 21 and the latter is exemplarily shown in FIGS. 22 to 27.

Figure 21:
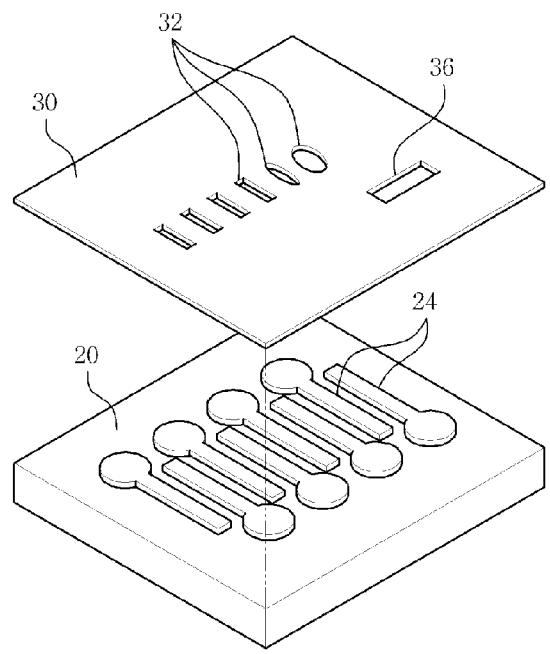

Referring to FIG. 21, the base layer 30 in the form of sheet or film is attached to the circuit board 20 according to a known laminating technique. The insertion holes 32 and 36 are formed in the base layer 30 before or after the base layer 30 is attached to the circuit board 20. The insertion holes 32 and 36 can be formed using known techniques such as laser processing, micro milling, micro machining, punching, drilling, etc. Although the positions, number and pitch of the insertion holes 32 and 36 are determined by the positions, number and pitch of the pads 24, the insertion holes 32 and 36 can have various shapes such as rectangular, circular and oval shapes.

Figure 22:
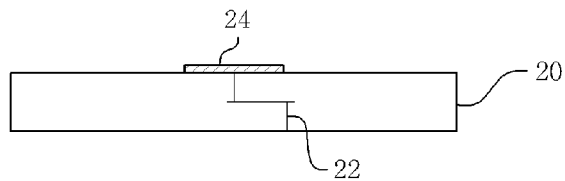
Figure 23:
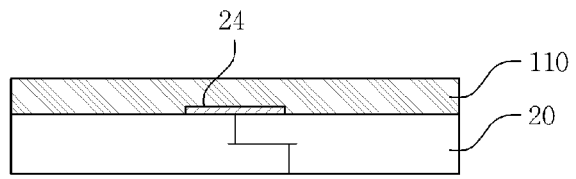

FIG. 22 shows a portion of the circuit board 20 having the pad 24 formed thereon. A photo mask layer 110 is temporarily formed on the circuit board 20 to cover the overall surface of the circuit board 20 including the pad 24, as shown in FIG. 23. The photo mask layer 110 is photoresist or dry film.

Figure 24:
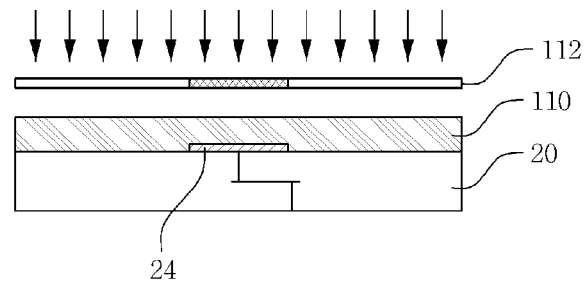
Figure 25:
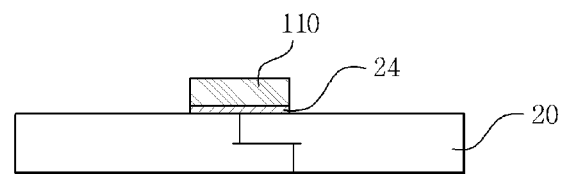

As shown in FIG. 24, the photo mask layer 110 is exposed through an exposure mask 112. The exposure mask 112 has a mask pattern corresponding to an insertion hole to be formed and the exposure process can employ both a positive method and a negative method. A developing process is performed after the exposure process to leave the photo mask layer 110 only on the portion corresponding to the insertion hole, as shown in FIG. 25.

Figure 26:
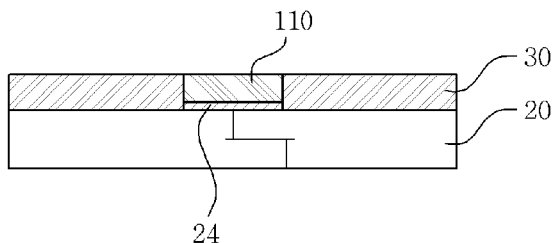
Figure 27:
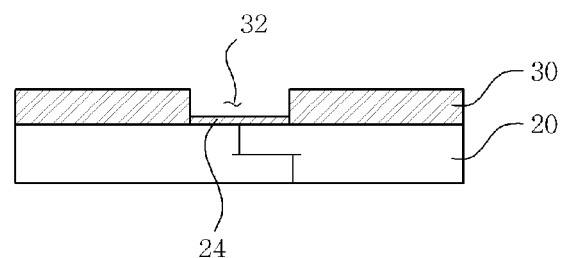

A baser layer material such as insulating organic material or epoxy is coated to form the flat base layer 30, as shown in FIG. 26, and the left photo mask layer 110 is removed to obtain the base layer 30 having the insertion hole 32 formed therein, as shown in FIG. 27. If required, a planarization process can be carried out before the photo mask layer 110 is removed. Subsequently, the plating layer (50 of FIG. 4)

described in the second embodiment can be formed on the sidewall of the insertion hole 32 in order to improve the adhesive strength of a conductive adhesive which will be explained later.

After the formation of the base layer 30 on the circuit board 20 and the insertion hole 32 in the base layer 30, probe pins are respectively inserted into the insertion holes 32 such that the probe pins are arranged on the circuit board 20 with fine pitch without electrically and mechanically interfering with neighboring probe pins. Here, the probe pins are aligned using an aligning mask layer and fixed using the conductive adhesive disposed in the insertion holes. These steps are shown in FIGS. 28 to 32.

Figure 28:
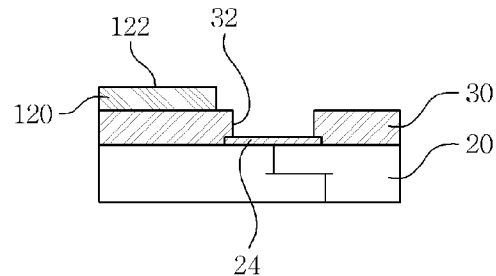

As shown in FIG. 28, a first aligning mask 120 is formed on the base layer 30. The first aligning mask layer 120 exposes the insertion hole 32 of the base layer 30 outwardly and has a flat surface 122 for aligning the laterally elongated beams of the probe pins to secure coplanarity.

The first aligning mask layer 120 can be formed using photoresist, dry film, PCB film, polyimide film, glass, etc. In the case of photoresist or dry film, the photoresist or dry film is coated or attached onto the base layer 30, exposed and developed to form the first aligning mask layer 120 on a desired portion. In the case of PCB film, polyimide film or glass, the PCB film, polyimide film or glass is formed in a size corresponding to the desired portion and attached to the base layer 30 to form the first aligning mask layer 120.

Figure 29:
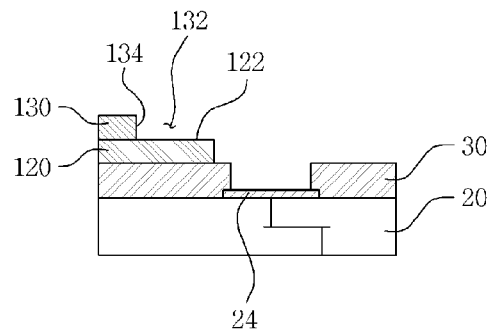
Figure 30:
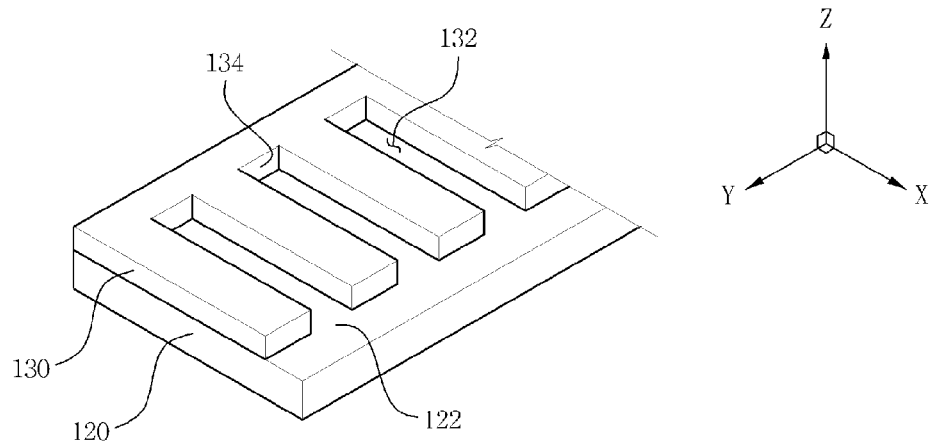

Subsequently, a second aligning mask layer 130 is formed on the first aligning mask layer 120, as shown in FIGS. 29 and 30 which are a cross-sectional view and a perspective view showing an exemplary step of forming the second aligning mask layer 130. The first aligning mask layer 120 is for aligning the probe pins in the vertical direction (z direction), that is, for securing coplanarity, while the second aligning mask layer 130 is for aligning the probe pins in the horizontal direction (x and y directions). Accordingly, aligning recesses 132 respectively corresponding to the probe pins are formed in the second aligning mask layer 130. Alignment of the probe pins in the x and y directions are achieved through sidewalls 134 of the aligning recesses 132.

It is desirable to form the second aligning mask layer 130 using photoresist or dry film which can be patterned because the aligning recesses 132 should be formed in the second aligning mask layer 130. However, the second aligning mask layer 130 can be formed of any other material as does the first aligning mask layer 120 if required. In this case, the aligning recesses 132 are formed through an additional process.

Figure 31:
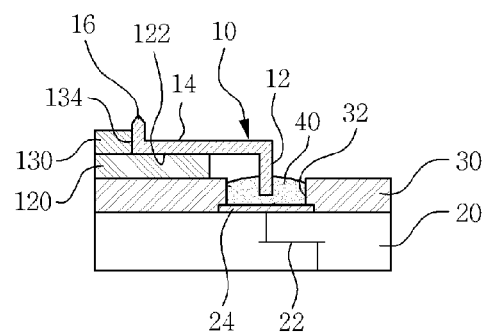

Upon the formation of the first and second aligning mask layers 120 and 130, the conductive adhesive 40 is filled in the insertion hole 32 of the base layer 30, as shown in FIG. 31. As described above, the conductive adhesive 40 is metal-filled liquid adhesive or solder paste. The conductive adhesive 40 can be filled in each insertion hole 32 according to an individual dispensing method and may be simultaneously filled in all of insertion holes 32 through silk screen before the aligning mask layers 120 and 130 are formed according to circumstances.

Subsequently, the probe pins 10 are inserted into the insertion holes 32 of the base layer 30 while being aligned through the aligning mask layers 120 and 130. That is, connectable roots 12 of the probe pins 10 are inserted into the conductive adhesive 40 filled in the insertion holes 32 and laterally elongated beams of the probe pins 10 are located in the aligning recesses 132 of the second aligning mask layer 130. Here, the laterally elongated beams 14 of the probe pins 10 are all placed on the flat surface 122 of the first aligning mask layer 120, and thus coplanarity is naturally secured. Furthermore, contact tips 16 of the probe pins 10 are all aligned in the horizontal direction through the sidewalls 134 of the aligning recesses 132 of the second aligning mask layer 130.

Figure 32:
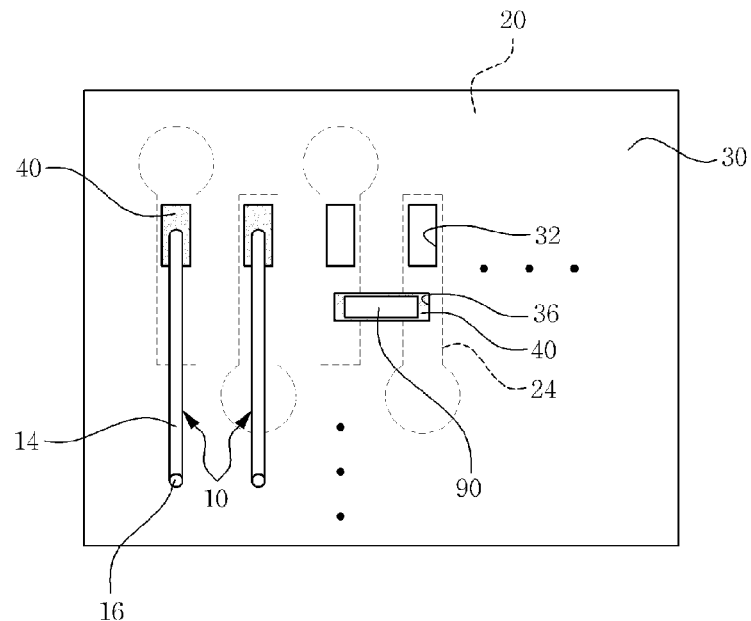

Thereafter, the conductive adhesive 40 is baked through a known process such as reflow or laser bonding to fix the probe pins 10. Then, the first and second aligning mask layers 120 and 130 are all removed to obtain the final structure of the probe assembly 100 as shown in FIG. 3. FIG. 32 is a plan view showing an exemplary final structure of the probe assembly.

Meanwhile, various electronic devices 90 in addition to the probe pins 10 can be mounted on the circuit board 20, as described above in the eighth embodiment. In this case, there is no need to precisely align the electronic devices 90 differently from the probe pins 10, and the insertion hole 36 of the base layer only provides positions at which the electronic devices 90 are mounted.

Furthermore, the supporting agent (60 of FIG. 5) described in the third embodiment can be additionally formed in order to improve a supporting strength to the probe pin 10 before and after the aligning mask layers 120 and 130 are removed in the step shown in FIG. 31. Moreover, when the base layer 30 and the first and second aligning mask layers 120 and 130 are formed of the same material such as photoresist or dry film, the base layer 30 is eliminated together with the first and second aligning mask layers 120 and 130 in the step of removing the first and second aligning mask layers 120 and 130 to obtain the probe assembly 100c shown in FIG. 6 according to the aforementioned fourth embodiment. Here, the supporting agent (60 of FIG. 5) can be formed such that the conductive adhesive 40 is fully enveloped by the supporting agent 60 after the base layer 30 is removed.

As described above, the probe pins 10 are aligned in the vertical and horizontal directions according to the first and second aligning mask layers 120 and 130, respectively. The horizontal alignment of the probe pins 10 can be achieved using various means other than the second aligning mask layer 130. Two examples of horizontally aligning the probe pins 10 using means other then the second aligning mask layer 130 will now be explained.

Figure 33:
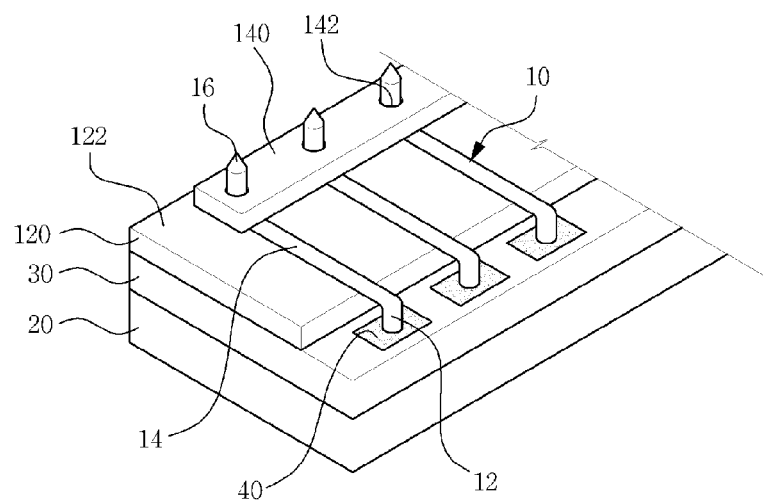
Figure 34:
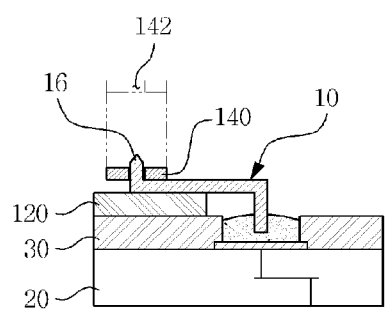

Referring to FIGS. 33 and 34, the first aligning mask layer 120 is formed, and then an additional aligning mask 140 instead of the second aligning mask layer is formed thereon. The aligning mask 140 has a plurality of aligning holes 142 formed therein at regular intervals. Accordingly, the probe pins 10 can be aligned in the horizontal direction when they are vertically inserted into the aligning holes 142 of the aligning mask 140 such that the contact tips 16 of the probe pins 10 penetrate the aligning holes 142.

Figure 35:
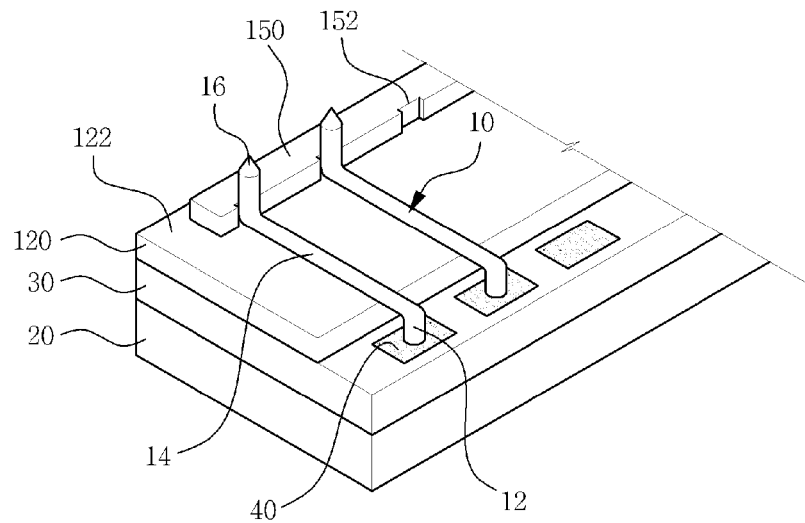
Figure 36:
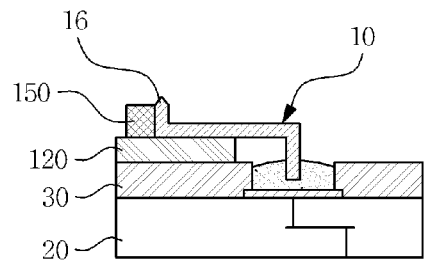

FIGS. 35 and 36 show another aligning mask 150 that substitutes for the second aligning mask layer. The aligning mask 150 is placed on the first aligning mask layer 120 and has a plurality of aligning recesses 152 formed at one side thereof at regular intervals. Differently from the aligning recesses 132 shown in FIG. 30, the aligning recesses 152 are only required to have depth to receive the contact tip 16 of the probe pin 10. The probe pins 10 can be aligned while the aligning mask 150 is moved in the horizontal direction.

The aligning masks 140 and 150 that substitute for the second aligning mask layer can be fixed to additional jigs (not shown) to control precise horizontal alignment.

As described above, the method for manufacturing a probe assembly according to the eleventh embodiment of the present invention can arrange a large number of probe pins with small pitch using the base layer having the insertion holes. Furthermore, the method for manufacturing a probe assembly can precisely arrange probe pins using the aligning mask layers or aligning mask to secure a high level of coplanarity. If the base layer 30 has sufficient coplanarity, the probe pins can be aligned using only the second aligning mask layer or aligning mask without using the first aligning mask layer. If required, the probe assembly can be manufactured without using the aligning mask layers or aligning mask.

12th Embodiment

Method for Manufacturing a Probe Assembly

FIGS. 37 to 51 are views showing a method for manufacturing a probe assembly in accordance with a twelfth embodiment of the present invention. The main point of the method for manufacturing a probe assembly according to the twelfth embodiment of the present invention is that a large number of probe pins are previously inserted using an additional pin array frame.

Figure 37:
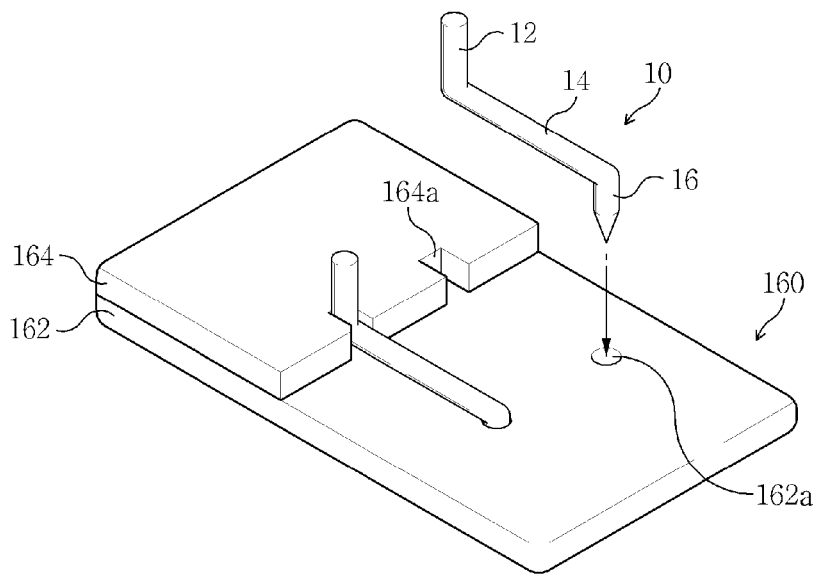
Figure 38:
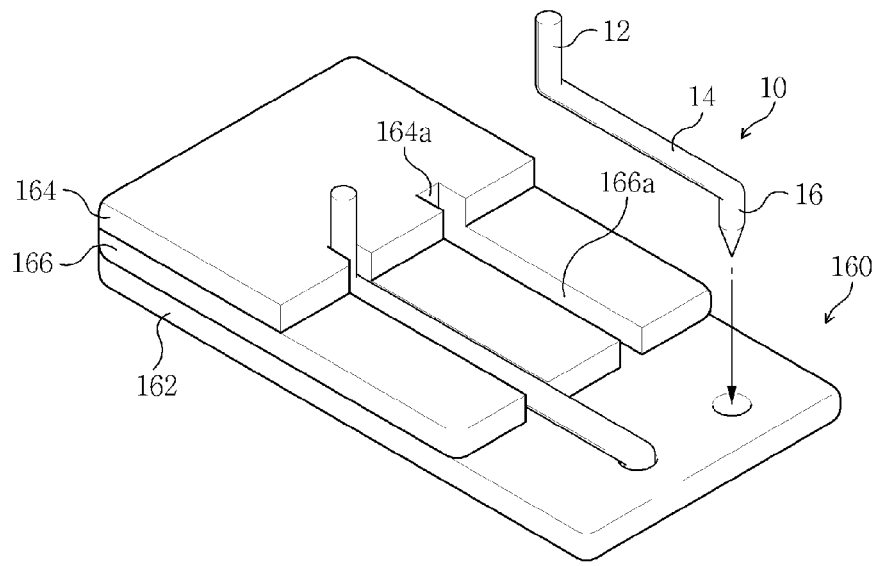

FIGS. 37 and 38 are perspective views showing a step of arranging the probe pins 10 in a pin array frame 160. Referring to FIG. 37, the pin array frame 160 includes a lower frame 162 and an upper frame 164. The lower frame 162 has a plurality of insertion holes 162a formed therein and the upper frame 164 has a plurality of insertion holes 164a formed therein. Contact tips 16 of the probe pins 10 are respectively inserted into the insertion holes 162a and connectable roots 12 of the probe pins 10 are respectively inserted into the insertion holes 164a.

As shown in FIG. 38, the pin array frame 160 can additionally include a middle frame 166 in addition to the lower frame 162 and the upper frame 164. The middle frame 166 has insertion holes 166a into which laterally elongated beams 14 of the probe pins 10 are respectively fitted.

The pin array frame 160 is a component for temporarily inserting the probe pins 10 during a process of manufacturing a probe assembly. A wafer has several hundreds of semiconductor devices formed thereon and each of the semiconductor devices has tens to hundreds of contact pads, in general, and thus the probe assembly may have tens of thousands of probe pins in order to simultaneously test the semiconductor devices throughout the wafer. Accordingly, a time required for a probe pin inserting process in the time required for the entire assembly manufacturing process is relatively long because a large number of probe pins should be inserted into the insertion holes of the base layer.

When the pin array frame 160 is used, it is possible to perform the probe pin inserting process independently of the entire probe assembly manufacturing process and then simultaneously insert the probe pins into the insertion holes of the base layer. This reduces the probe assembly manufacturing time. Particularly, in the case where the probe assembly is order-manufactured, the probe pins 10 can be inserted into the pin array frame 160 in advance to remarkably reduce the time required to deliver the probe assembly to the orderer.

A method for manufacturing a probe assembly using the pin array frame 160 will now be explained. Although the manufacturing method is applied to the probe assembly of the seventh embodiment in this embodiment, it can be also applied to the probe assemblies according to other embodiments.

Figure 39:
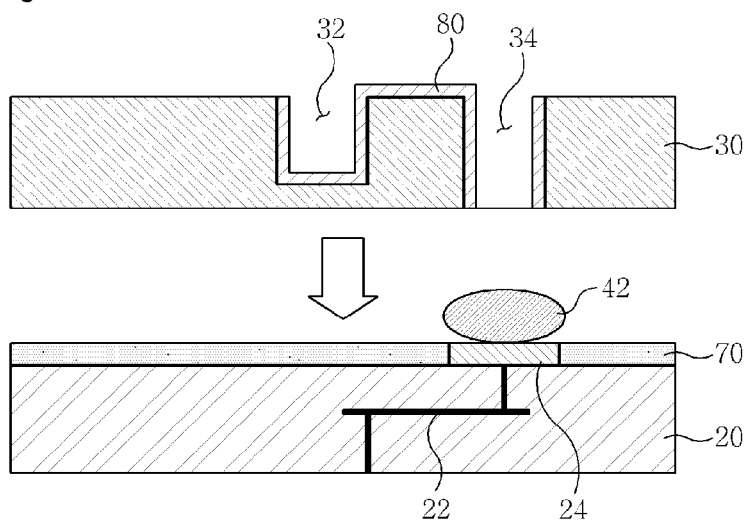

FIGS. 39 to 42 show a step of forming the base layer 30. Referring to FIG. 39, first insertion holes 32 and second insertion holes 34 are formed in the base layer 30, a photoresist pattern (not shown) is formed on the base layer 30, and the redistribution line 80 is formed using a deposition process.

Figure 40:
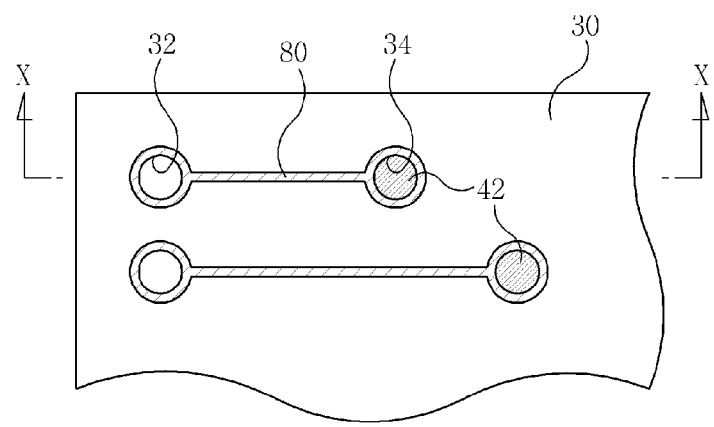
Figure 41:
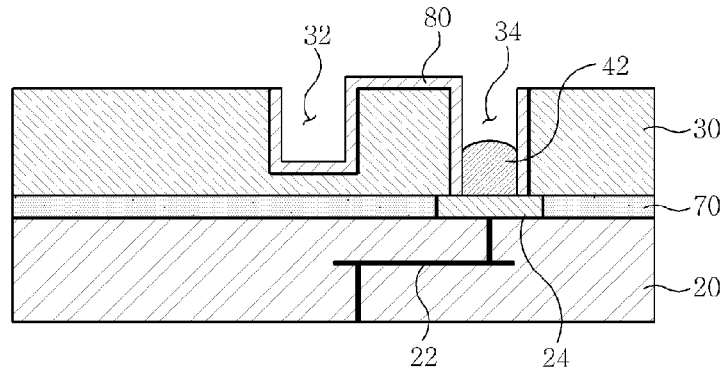

Subsequently, the photoresist pattern is removed and the base layer 30 is bonded to the circuit board 20 through the nonconductive adhesive 70. Here, the second conductive adhesive 42 is previously formed on the pad 24 of the circuit board 20. As shown in FIGS. 40 and 41, the second conductive adhesive 42 is formed in the second insertion holes 34 of the base layer 30 when the base layer 30 is bonded to the circuit board 20.

The second conductive adhesive 42 can use reflowable solder ball, solder paste and metal-filled liquid adhesive. The second conductive adhesive 42 can be filled in the second insertion hole 34 after the base layer 30 is bonded to the circuit board 20.

Figure 42:
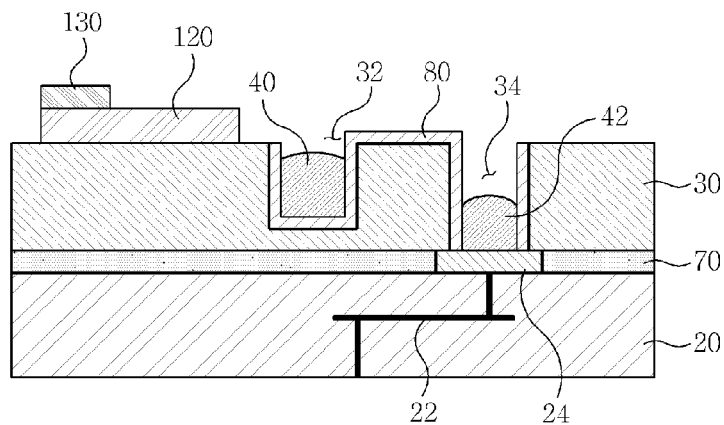

Referring to FIG. 42, the aligning mask layers 120 and 130 are formed on the base layer 30, and then the first conductive adhesive 40 is filled in the first insertion hole 32.

Figure 43:
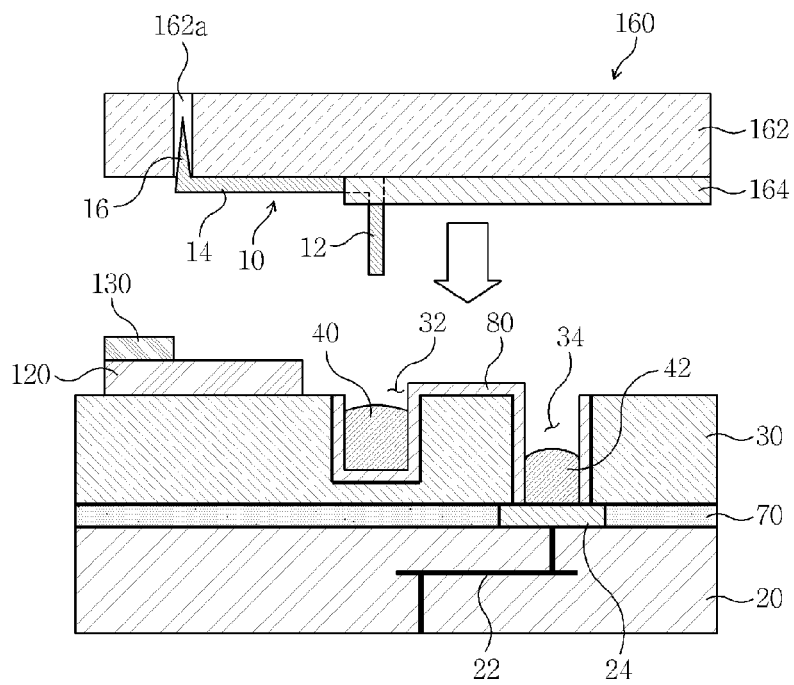
Figure 44:
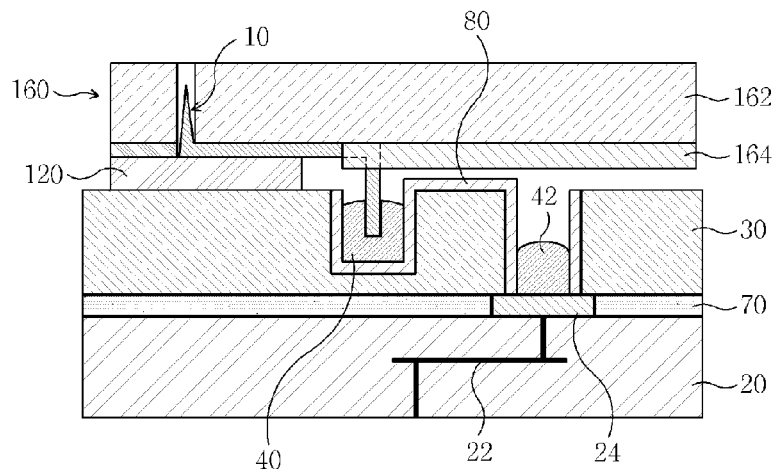
Figure 45:
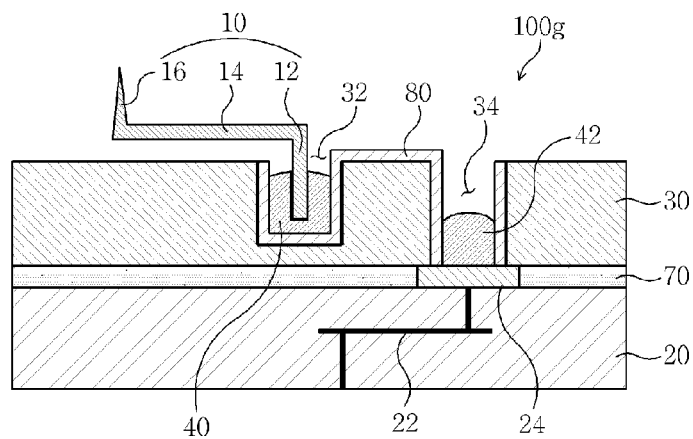

FIGS. 43 to 45 show an exemplary step of inserting the probe pins using the pin array frame. Referring to FIGS. 43 and 44, the probe pins 10 fitted into the pin array frame 160 are inserted into the first insertion holes 32 of the base layer 30 all at once. Here, laterally elongated laterally elongated beams 14 and the contact tips 16 of the probe pins 10 are aligned by the aligning mask layers 120 and 130 and the connectable roots 12 of the probe pins 10 are inserted into the first insertion holes 32 of the base layer 30 and fixed by the conductive adhesive 40.

Figure 46:
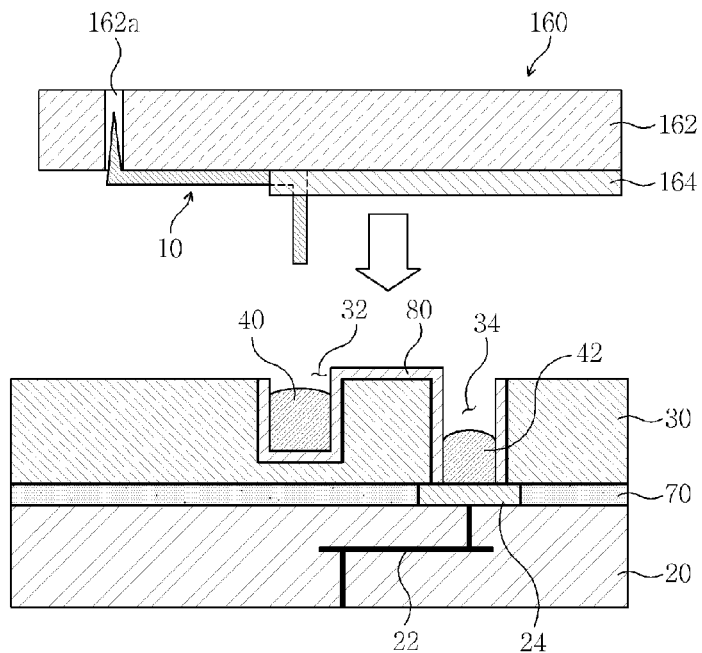

The direction of inserting the probe pins 10 can be opposite to the direction shown in FIG. 43. That is, the probe pins 10 can be inserted while being located down such that the connectable roots 12 of the probe pins 10 look upward and the base layer 30 is disposed upward such that the first insertion holes 32 look downward. Furthermore, no aligning mask can be disposed on the base layer 30, as shown in FIG. 46.

After the probe pins 10 are inserted into the first insertion holes 32 and fixed by the conductive adhesive 40, the pin array frame 160 and the aligning mask layers 120 and 130 are all removed to obtain the final structure of the probe assembly 100g, as shown in FIG. 45.

Figure 47:
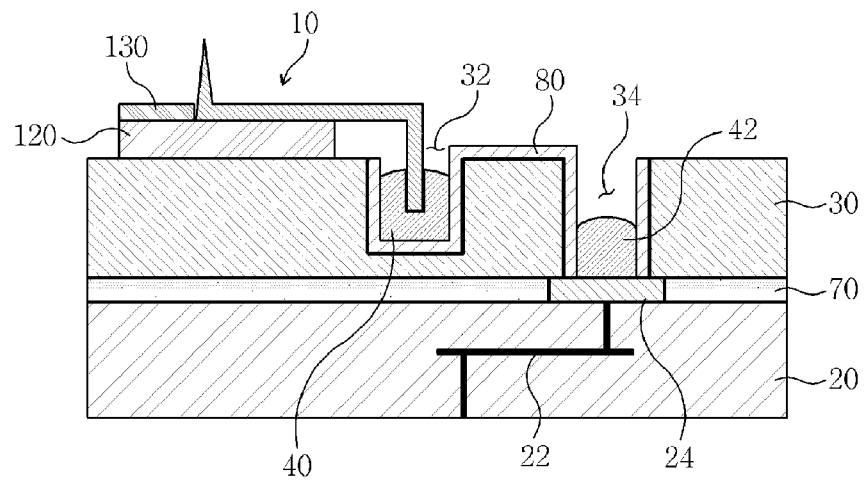
Figure 48:
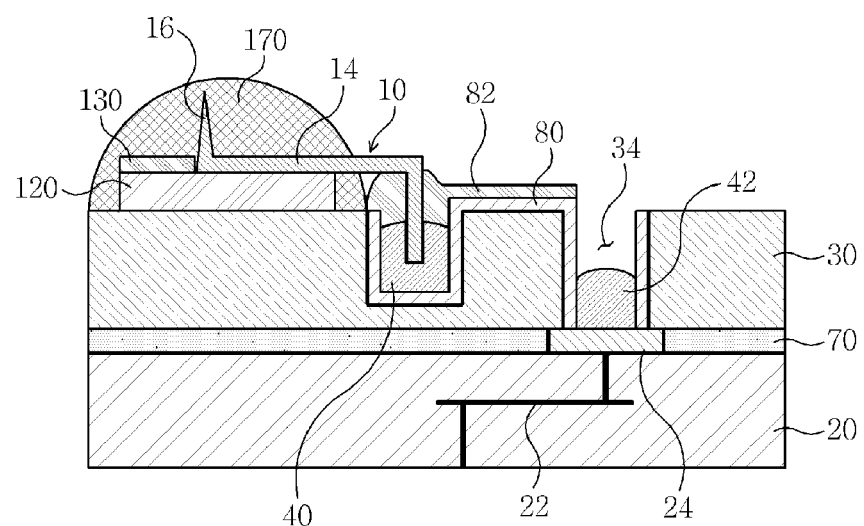

FIGS. 47 and 48 show still another exemplary step of inserting the probe pins. This step forms the plating layer 82 on the redistribution line 80 as described above with reference to FIG. 11. When the pin array frame 160 is removed after the probe pins 10 are inserted into the first insertion holes 32 of the base layer 30 all at once using the pin array frame 160, the structure shown in FIG. 47 is obtained.

Subsequently, a nonconductive protective material 170 is coated on the laterally elongated beams 14 and the contact tips 16 of the probe pins 10 and a plating process is performed, as shown in FIG. 48. Accordingly, the plating layer 82 is formed on the outwardly exposed connectable roots 12 of the probe pins 10 and the redistribution line 80. After the plating layer 82 is formed, the protective material 170 and the aligning mask layers 120 and 130 are removed.

Figure 49:
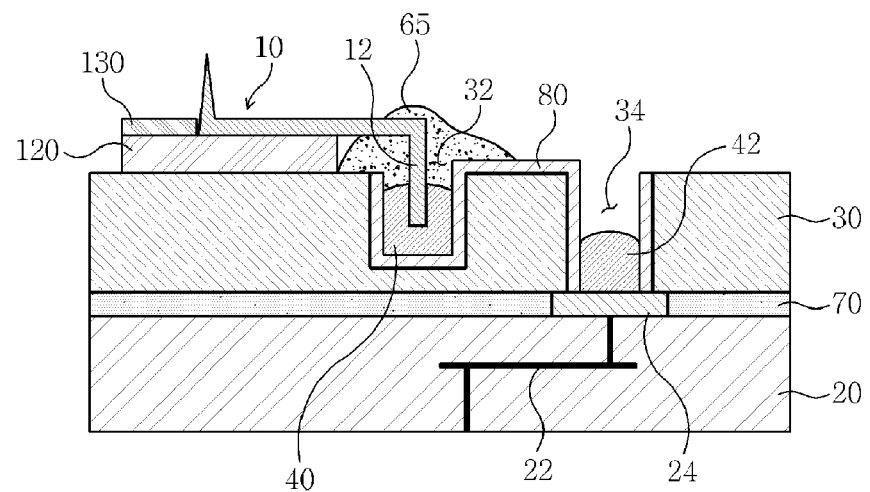
Figure 50:
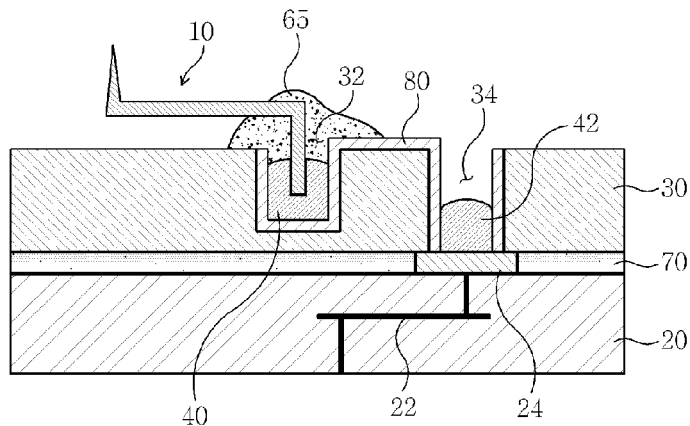

FIGS. 49 and 50 show still another exemplary step of inserting the probe pins. This step forms the damper 65 enveloping the connectable root 12 of the probe pin 10. The damper 65 is substantially identical to the damper 65 described above with reference to FIG. 8 although it depends on whether the redistribution line 80 exists.

Figure 55:
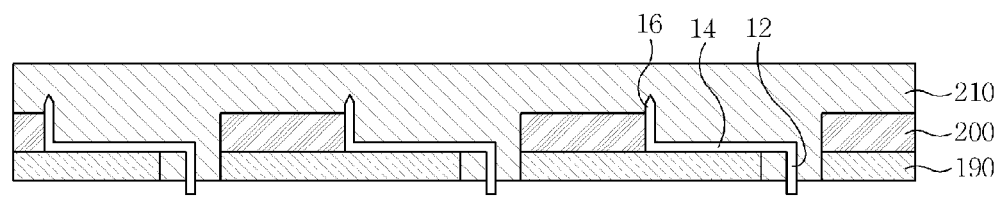

As shown in FIG. 49, the damper 65 is coated to envelop the connectable root 12 of the probe pin 10 while the pin array frame 160 shown in FIG. 55 is removed and the aligning mask layers 120 and 130 are left. Then, the aligning mask layers 120 and 130 are removed, as shown in FIG. 50.

Figure 51:
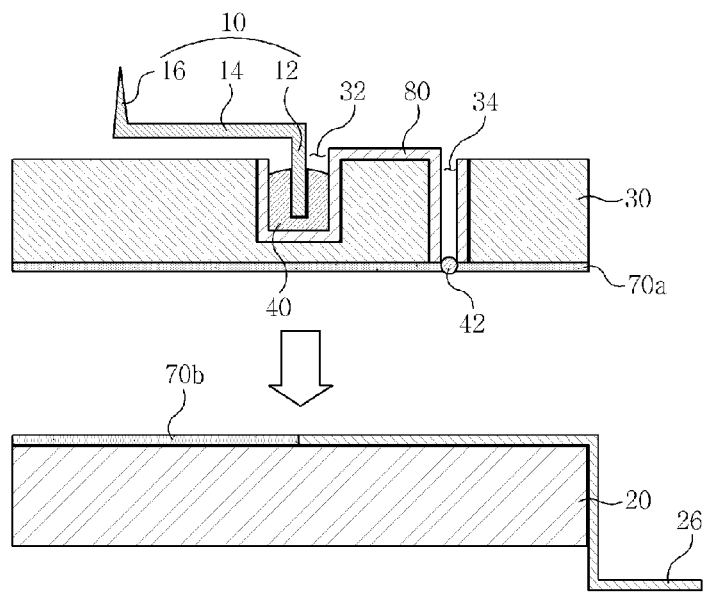
FIG. 51 is a cross-sectional view showing an exemplary step of bonding a circuit board and a base layer.

FIG. 51 shows an exemplary step of bonding the circuit board and the base layer. This step corresponds to the case where the probe assembly 100k shown in FIG. 15 is manufactured. Referring to FIG. 51, the circuit pattern 26 is formed on the top surface and the side of the circuit board 20 and a nonconductive adhesive 70a is coated on a portion of the top surface of the circuit board 20 on which the circuit pattern 26 is not formed. The second conductive adhesive 42 is formed on a portion of the bottom face of the base layer 20, which corresponds to the second insertion hole 34, and a nonconductive adhesive 70a is coated on the other portion of the bottom face of the base layer 30. Accordingly, the base layer 30 can be bonded to the circuit board 20 through the nonconductive adhesives 70a and 70b. The bonding structure shown in FIG. 16 can be obtained in the same manner as the method shown in FIG. 15 except that the circuit pattern 26 instead of the second conductive adhesive is inserted into the second insertion hole 34.

13th Embodiment

Method for Manufacturing a Probe Assembly

FIGS. 52 to 57 show a method for manufacturing a probe assembly in accordance with a thirteenth embodiment of the present invention. This method uses a means similar to the pin array frame of the twelfth embodiment.

Figure 52:
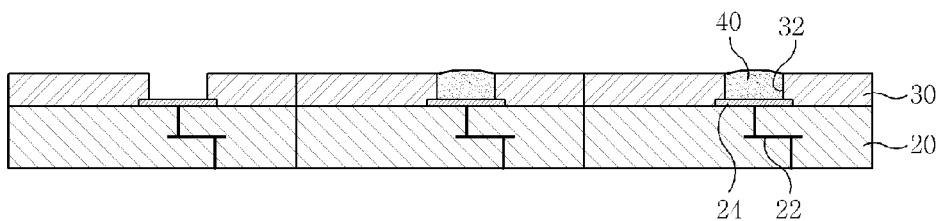
FIGS. 52 to 57 are cross-sectional views showing a method for manufacturing a probe assembly in accordance with a thirteenth embodiment of the present invention.

Referring to FIG. 52, the base layer 30 is formed on the circuit board 20 and has insertion holes 32 corresponding to pads 24 of the circuit board 20. The conductive adhesive 40 is filled in each insertion hole 32.

Figure 53:
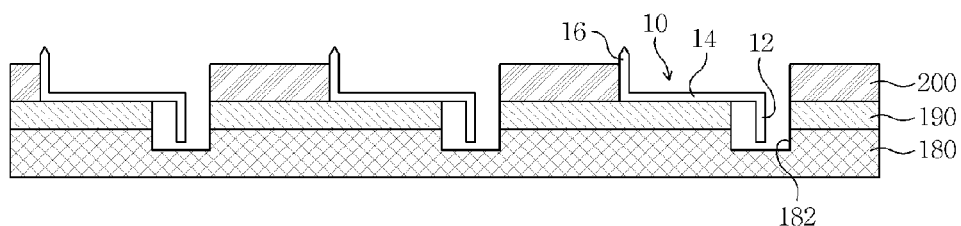

The probe pins 10 are additionally prepared, as shown in FIG. 53. Referring to FIG. 53, a base plate 180 made of a material such as rubber or polymer is prepared. The base plate 180 includes insertion holes 182 respectively corresponding to the insertion holes of the base layer. Mask layers 190 and 200 similar to the aforementioned aligning mask layers are sequentially formed on the base plate 180. The mask layers 190 and 200 are formed of photoresist or dry film material. The probe pins 10 are aligned through the mask layers 190 and 200 and respectively inserted into the insertion holes 182 of the base plate 180.

Figure 54:
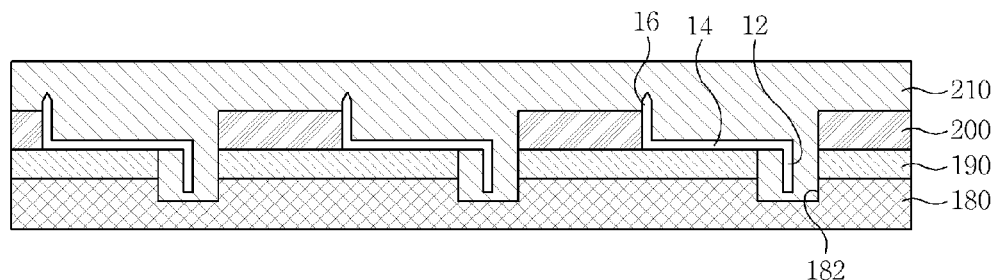

Referring to FIG. 54, a supporting layer 210 is formed on the mask layers 190 and 200. The supporting layer 210 is made of a material such as epoxy and fixes the probe pins 10 being inserted into the insertion holes 182.

Subsequently, the base plate 180 shown in FIG. 54 is removed, as shown in FIG. 55. Then, the bottom ends of the connectable roots 12 of the probe pins 10 are projected from the lower mask layer 190 downward. In this step, a dry film or an adhesive film can be interposed between the base plate and the lower mask layer 190 to physically easily separate the base plate from the mask layer so as to easily remove the base plate. In addition, the separated base plate can be re-used.

Figure 56:
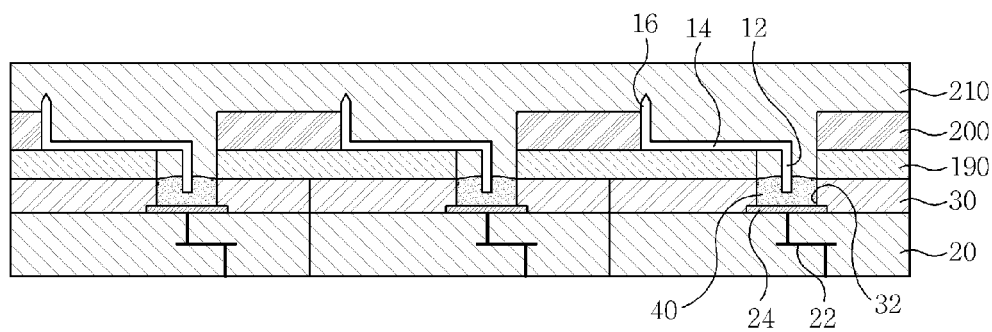
Figure 57:
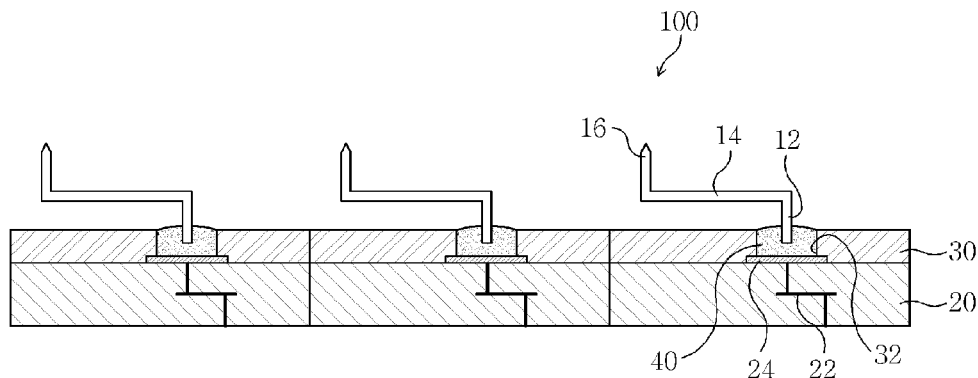

Referring to FIG. 56, the probe pins 10 are inserted into the insertion holes 32 of the base layer 30. When the conductive adhesive 40 filled in the insertion holes 32 is baked and securely fixes the probe pins 10, the mask layers 190 and 200 and the supporting layer 210 are all removed to obtain the final structure shown in FIG. 57. The mask layers 190 and 200 and the supporting layer 210 are removed using known solvent suitable for their materials.

14th Embodiment

Method for Manufacturing a Probe Assembly

FIGS. 58 to 61 are cross-sectional views showing a method for manufacturing a probe assembly in accordance with a fourteenth embodiment of the present invention. This method is characterized by that a conductive adhesive is formed before an aligning mask layer is formed and a protective layer is used in order to protect the conductive adhesive.

Figure 58:
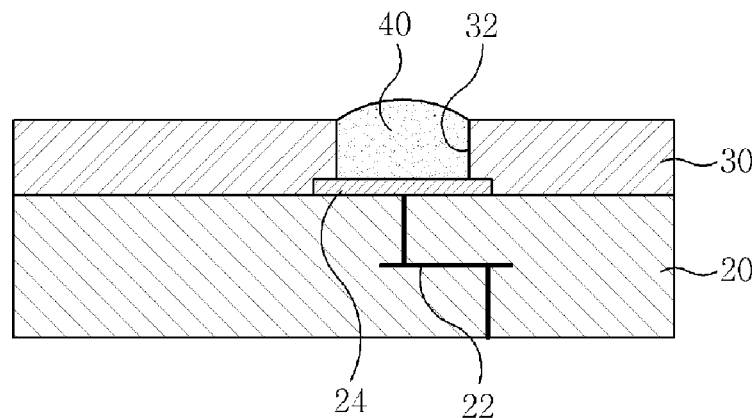
FIGS. 58 to 61 are cross-sectional views showing a method for manufacturing a probe assembly in accordance with a fourteenth embodiment of the present invention.

Referring to FIG. 58, the base layer 30 is formed on the circuit board 20 and has the insertion hole 32 corresponding to the pad 24 of the circuit board 20. The conductive adhesive 40 is filled in the insertion hole 32. That is, the conductive adhesive 40 is simultaneously filled in the insertion holes 32 of the base layer 30 according to silk screen method without using individual dispensing method before the aligning mask layer is formed.

Figure 59:
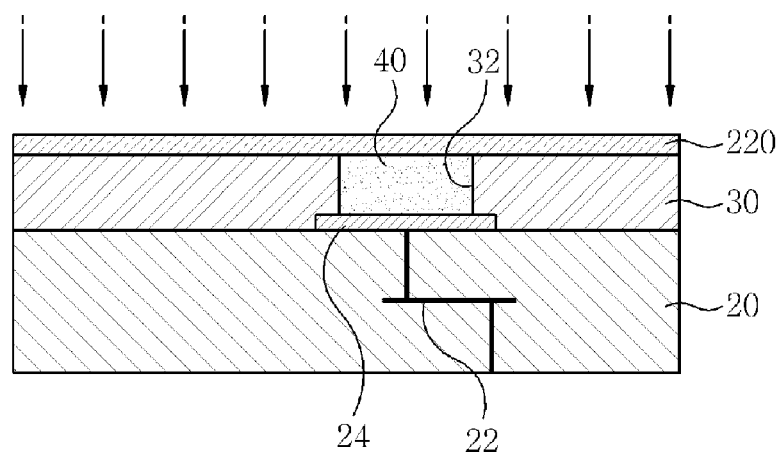

The conductive adhesive 40 may be affected by the following process which forms the aligning mask layers. That is, the conductive adhesive 40 may be deteriorated. Accordingly, a protective layer 220 covering the conductive adhesive 40 is formed on the base layer 30 to protect the conductive adhesive 40, as shown in FIG. 59. Photoresist or dry film can be used for the protective layer 220.

Figure 60:
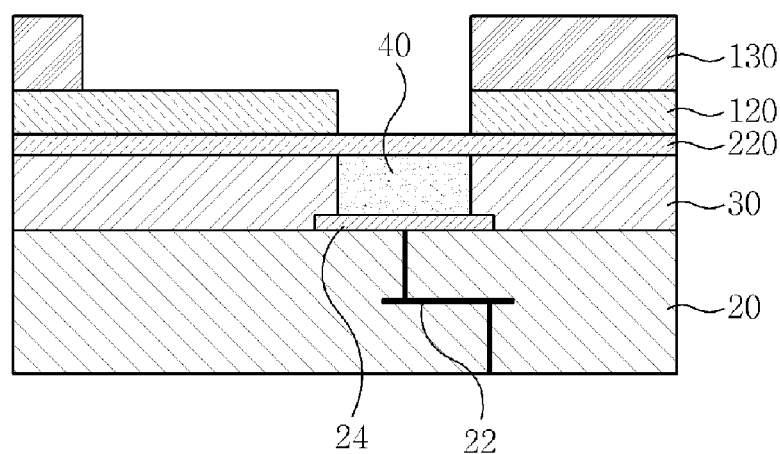

Subsequently, the aligning mask layers 120 and 130 are formed on the protective layer 220, as shown in FIG. 60. Here, the conductive adhesive 40 is protected by the protective layer 220 even though exposure and development processes are performed in order to form the aligning mask layers 120 and 130.

Figure 61:
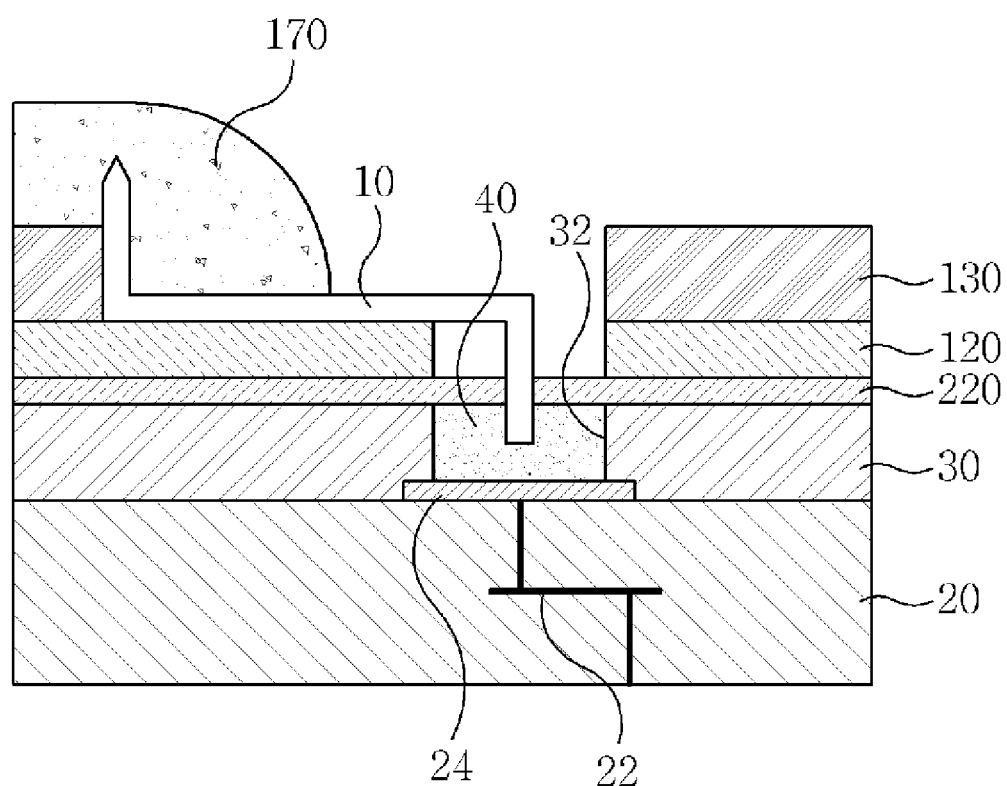

Referring to FIG. 61, the connectable root of the probe pin 10 is inserted into the insertion hole 32 of the base layer 30 while the probe pin 10 is aligned through the aligning mask layer 120 and 130. Here, the probe pin 10 penetrates the protective layer 220 to be inserted into the conductive adhesive 40 filled in the insertion hole 32. After the probe pin 10 is inserted, a supporting agent 170 is coated to fix the probe pin 10, and the connectable root of the probe pin 10 being inserted into the insertion hole 32 is fixed through reflow.

Then, the supporting agent 170, the aligning mask layers 120 and 130 and the protective layer 220 are all removed to obtain the final structure.

While the present invention has been particularly shown and described with reference to exemplary embodiments thereof, it will be understood by those of ordinary skill in the art that various changes in form and details may be made therein without departing from the spirit and slope of the present invention as defined by the following claims.

The invention claimed is:

1. A probe assembly for testing semiconductor devices formed on a wafer, comprising:
    a circuit board including a circuit pattern formed therein and pads formed thereon;
    a base layer formed on the top surface of the circuit board and having insertion holes each of which corresponds to each of the pads, wherein the base layer is formed of the same semiconductor material as the wafer;
    a conductive adhesive formed in the insertion holes; and
    probe pins each of which has a connectable root vertically inserted into the corresponding insertion hole and mechanically fixed by the conductive adhesive, a laterally elongated beam bent at right angle to the connectable root and extended lengthwise in parallel with and at a distance from the surface of the circuit board, and a contact tip extended upwardly from one end of the laterally elongated beam, being opposite to the connectable root, the probe pins being electrically connected to the pads.

2. The probe assembly of claim 1, further comprising a plating layer formed on sidewalls of the insertion holes of the base layer.

3. A probe assembly for testing semiconductor devices formed on a wafer, comprising:
    a circuit board having an upper surface and a pad formed on the upper surface;

a base layer formed on the upper surface of the circuit board and having an insertion hole formed therein;

a conductive adhesive formed in the insertion hole; and a probe pin having a connectable root, a laterally elongated beam, and a contact tip, the connectable root being inserted into the insertion hole and fixed by the conductive adhesive, the laterally elongated beam being bent from the connectable root and extended lengthwise in parallel with and at a distance from the upper surface of the circuit board, and the contact tip being extended upwardly from one end of the laterally elongated beam, wherein the probe pin is electrically connected to the pad through the conductive adhesive.

4. The probe assembly of claim 3, wherein the insertion hole of the base layer is located on the pad of the circuit board.

5. The probe assembly of claim 4, wherein the base layer is formed of semiconductor material.

6. A probe assembly for testing semiconductor devices formed on a wafer, comprising:

a circuit board having an upper surface, a lower surface, and a pad formed on the upper surface;

a base layer having a first surface, a second surface being opposite to the first surface, and an insertion hole formed from the first surface to the second surface, wherein the first surface adjoins the upper surface of the circuit board;

a conductive adhesive formed in the insertion hole; and a probe pin including:
- a connectable root inserted into the insertion hole, mechanically fixed by the conductive adhesive, and electrically coupled to the pad through the conductive adhesive;
- a laterally elongated beam bent from the connectable root and extended lengthwise in parallel with and at a distance from the second surface of the base layer; and
- a contact tip being extended upwardly from one end of the laterally elongated beam.

7. The probe assembly of claim 6, wherein the insertion hole of the base layer is located on the pad of the circuit board.

8. The probe assembly of claim 7, wherein the base layer is formed of semiconductor material.

* * * * *